(12) United States Patent
Pescianschi et al.

(10) Patent No.: US 11,250,106 B2
(45) Date of Patent: Feb. 15, 2022

(54) MEMORY DEVICE AND MATRIX PROCESSING UNIT UTILIZING THE MEMORY DEVICE

(71) Applicants: Dmitri Pescianschi, Quedlinburg (DE); Ilya Sorokin, Naples, FL (US)

(72) Inventors: Dmitri Pescianschi, Quedlinburg (DE); Ilya Sorokin, Naples, FL (US)

(*) Notice: Subject to any disclaimer, the term of this patent is extended or adjusted under 35 U.S.C. 154(b) by 305 days.

(21) Appl. No.: 16/414,810

(22) Filed: May 17, 2019

(65) Prior Publication Data

US 2020/0019587 A1 Jan. 16, 2020

Related U.S. Application Data

(60) Provisional application No. 62/673,297, filed on May 18, 2018.

(51) Int. Cl.

| | | |
|---|---|---|
| *G06F 17/16* | (2006.01) | |
| *G02F 1/163* | (2006.01) | |
| *G06F 17/17* | (2006.01) | |
| *G03C 1/73* | (2006.01) | |
| *G11C 13/00* | (2006.01) | |

(52) U.S. Cl.
CPC .............. *G06F 17/16* (2013.01); *G02F 1/163* (2013.01); *G03C 1/733* (2013.01); *G06F 17/175* (2013.01); *G11C 13/004* (2013.01); *G11C 13/0069* (2013.01); *G11C 2213/71* (2013.01)

(58) Field of Classification Search
CPC ... G06F 17/16; G06F 17/175; G11C 2213/71; G11C 13/041; G11C 13/004; G11C 13/0069; G03C 1/733; G02B 6/12
See application file for complete search history.

(56) References Cited

U.S. PATENT DOCUMENTS

| | | | |
|---|---|---|---|
| 6,291,132 B1 * | 9/2001 | Glushko | G11B 7/00455 369/275.3 |
| 6,675,187 B1 * | 1/2004 | Greenberger | G06F 1/02 708/622 |
| 10,223,004 B2 * | 3/2019 | Sethuraman | G06F 3/0658 |
| 2005/0162883 A1 * | 7/2005 | Nejad | G11C 11/16 365/63 |
| 2013/0308363 A1 * | 11/2013 | Scheuerlein | G11C 13/003 365/63 |

* cited by examiner

*Primary Examiner* — Jaweed A Abbaszadeh
*Assistant Examiner* — Huy Duong
(74) *Attorney, Agent, or Firm* — Anna Vishev

(57) ABSTRACT

A matrix processing apparatus having a three-dimensional slice access memory and an input-/output block. The slice access memory includes cells organized into cell slices, each slice storing an entire selected data matrix. The three-dimensional slice access memory is configured to allow read/write access to the entire data matrix at the same time. The input/output block is connected to the three-dimensional slice access memory and is configured to format data into a format acceptable to the three-dimensional slice access memory.

27 Claims, 18 Drawing Sheets

FIG. 1
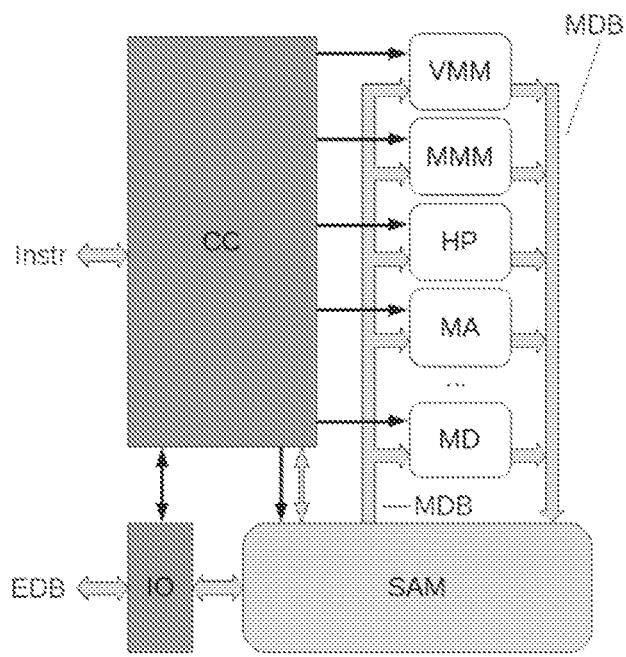
FIG. 2
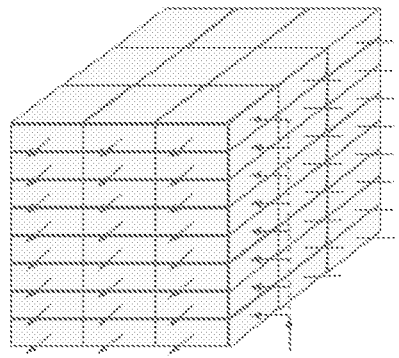
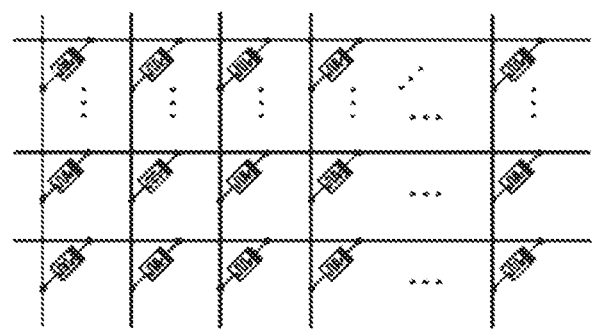
FIG. 3 PRIOR ART

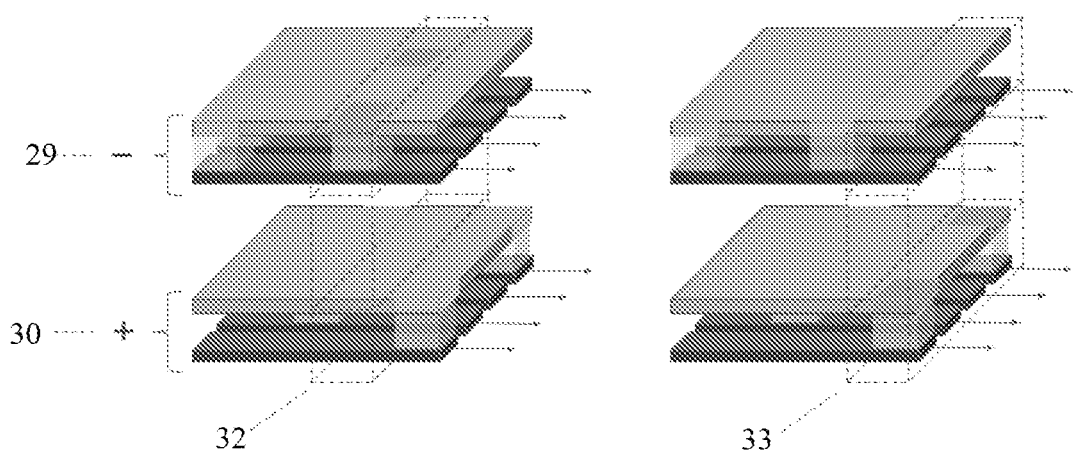
FIG. 14(a)                    FIG. 14(b)
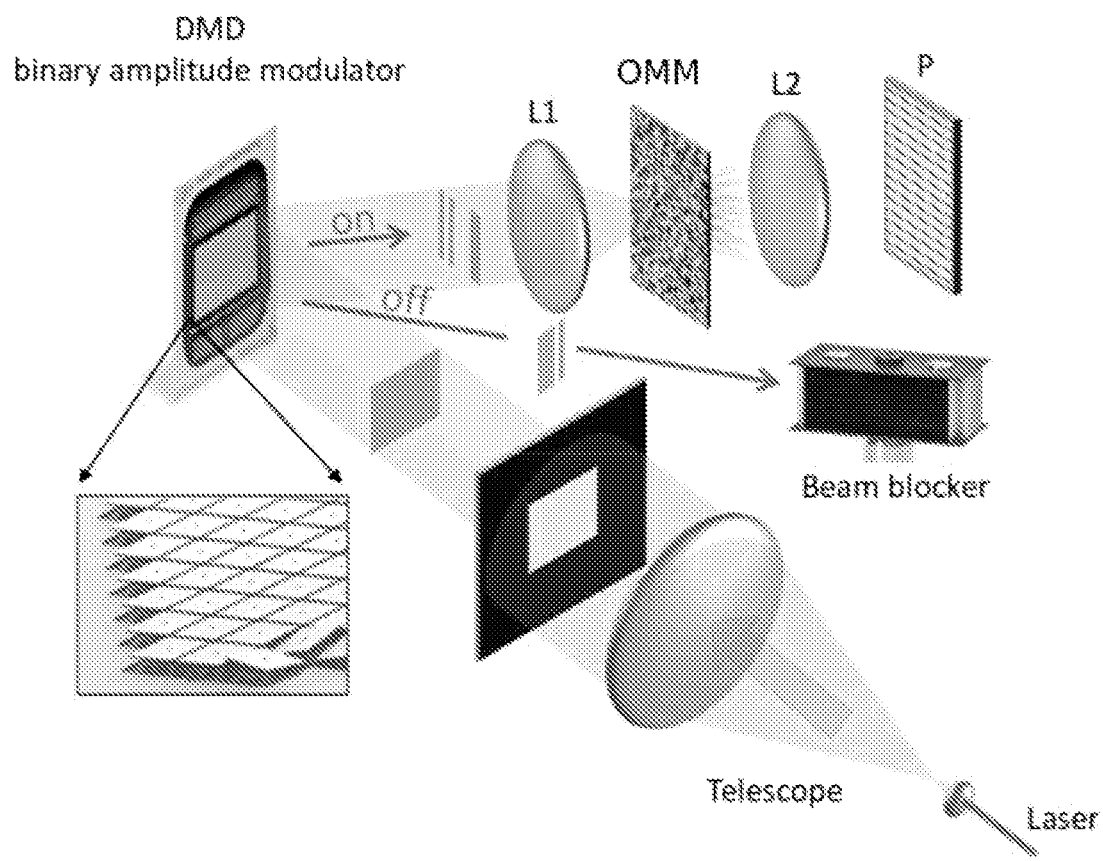
FIG. 15

MEMORY DEVICE AND MATRIX PROCESSING UNIT UTILIZING THE MEMORY DEVICE

CROSS-REFERENCE TO RELATED APPLICATIONS

This Application is a non-provisional application from and claims all rights of priority to U.S. Provisional Patent Application No. 62/673,297, filed on May 18, 2018. The '297 Application is incorporated herein by reference.

BACKGROUND OF THE INVENTION

The present invention relates to data processing and storage systems. More specifically, a new architecture for universal matrix analog microprocessors and matrix memory for processing data using matrix computing is proposed. The present invention can be attributed to the category of microprocessors, since by the completeness of the functionality this device can be considered multipurpose. Unlike MPU, the basis of conventional microprocessors are arithmetic logic operations performed on bits, as well as integers and real numbers.

The following are a couple of examples of the prior art devices:

Google Tensor Processing Unit (Google TPU) [1]. TPU is not a universal microprocessor, it is designed to work on the narrowly specialized tasks. The main operation of the TPU is vector-matrix multiplication, mostly for small matrices, with a maximum size of 256×256. In addition, all calculations are digital, and therefore the dimensions of the device are quite large for a matrix of this small size, and the energy costs are commensurate with the costs of other microprocessor devices.

Optical microchip EnLight256 [2]. The main operation in this device, as in the TPU, is vector-matrix multiplication, and matrices size is 256×256. Unlike the TPU, the EnLight256 matrix multiplication unit is an optical analog device. EnLight256 is even more narrowly specialized device than TPU—this device single purpose is the vector-matrix multiplication.

SUMMARY OF THE INVENTION

In its most general aspect, the invention is a matrix processing apparatus having a three-dimensional slice access memory and an input-/output block. The slice access memory includes cells organized into cell slices, each slice storing an entire selected data matrix. The three-dimensional slice access memory is configured to allow read/write access to the entire data matrix at the same time. The input/output block is connected to the three-dimensional slice access memory and is configured to format data into a format acceptable to the three-dimensional slice access memory.

In one of its specific aspects, the matrix processing apparatus includes a set of devices for various matrix operations. These devices preferably include a Vector-Matrix Multiplication block (VMM), a Matrix-Matrix Multiplication block (MMM); a Hadamard Product block (HP) for element-wise multiplication of matrices, a Matrix Addition block (MA), and a Matrix Determinant calculation block (MD). As further explained herein, other blocks may also be included.

All listed and presumed matrix computing devices' inputs and outputs preferably include Matrix Registers (MR), which act as a temporary local matrix memory. Each computing device has its own local MR, inaccessible to other computing devices. The purpose of MR is to prepare the matrices which will be used in the calculations. It is also used in formation of matrices that represent the result of the calculations. These results are further stored in the permanent matrix memory—Slice Access Memory (SAM), described below.

Slice Access Memory (SAM) is the proposed shared distributed matrix memory used by the MPU. It is a special type of memory which allows simultaneous access to both read and write operations for the whole matrix. Communication of computing devices with SAM is carried out by a special Matrix Data Bus (MDB), which simultaneously transmits the entire matrix as a whole. SAM communication with external devices is performed via External Data Bus (EDB) by the Input/Output unit (IO). EDB IO unit converts data from the external device format to the SAM format. The operations of the matrix devices and memory is controlled by the Central Controller (CC). CC control is carried out by a flow of instructions (Instr), coming through the EDB (FIG. 1).

Slice Access Memory (SAM) is an information storage device (memory) that provides read and write access to the entire matrix at the same time. Addressing in this type of memory is a pointer not of a single cell, but of a vector and even an entire matrix (FIG. 2). Like all of the above-mentioned devices, the SAM dimension must be matched to the Matrix Data Bus (MDB) dimension, and the data is provided in the same general format as used by all other devices.

In the preferred embodiment, the Matrix Data Bus (MDB) is a data bus that provides communications between SAM and all matrix data processing devices. In order to avoid possible bottleneck generated within the system, the number of MDB bus channels must correspond to the selected matrix dimension. All devices are connected to the bus in parallel, and all devices are simultaneously provided with the same data. Data handling is controlled by CC commands passed on to the devices.

Input/Output Block (IO) is preferably a device which converts external data into the internal format of the disclosed system and vice versa. In addition, IO buffers (temporarily stores) external data in the form of a matrix, which is then written to SAM. The IO buffer is its Matrix Register (MR).

Central Controller (CC) is preferably a device providing programmatic control of the IO, SAM, and all matrix devices. The control is performed by the flow of instructions coming from the external data bus. CC can be a multi-core device that provides multi-threaded management of the Matrix Processing Unit (MPU).

Vector-Matrix Multiplication (VMM) is the device for matrix multiplication of the matrix W by a vector (column) X, where the number of columns of the matrix W is equal to the length of the vector X:

WX=Y $$\begin{bmatrix} w_{11} & w_{12} & w_{13} & \ldots & w_{1n} \\ w_{21} & w_{22} & w_{23} & \ldots & w_{2n} \\ w_{31} & w_{32} & w_{33} & \ldots & w_{3n} \\ \ldots & \ldots & \ldots & \ldots & \ldots \\ w_{m1} & w_{m2} & w_{m3} & \ldots & w_{mn} \end{bmatrix} \begin{bmatrix} x_1 \\ x_2 \\ x_3 \\ \ldots \\ x_n \end{bmatrix} =$$

-continued $$\begin{bmatrix} (w_{11}x_1) + (w_{12}x_2) + (w_{13}x_{13}) + \ldots + (w_{1n}x_n) \\ (w_{21}x_1) + (w_{22}x_2) + (w_{23}x_{13}) + \ldots + (w_{2n}x_n) \\ (w_{31}x_1) + (w_{32}x_2) + (w_{33}x_{13}) + \ldots + (w_{3n}x_n) \\ \ldots \\ (w_{m1}x_1) + (w_{m2}x_2) + (w_{m3}x_{13}) + \ldots + (w_{mn}x_n) \end{bmatrix} = \begin{bmatrix} y_1 \\ y_2 \\ y_3 \\ \ldots \\ y_m \end{bmatrix}$$

An alternative is also possible: it is a device for matrix multiplication of a vector (string) X by a matrix W whose number of rows is equal to the length of the vector X: XW=Y $$[x_1 \ x_2 \ x_3 \ \ldots \ x_m] \begin{bmatrix} w_{11} & w_{12} & w_{13} & \ldots & w_{1n} \\ w_{21} & w_{22} & w_{23} & \ldots & w_{2n} \\ w_{31} & w_{32} & w_{33} & \ldots & w_{3n} \\ \ldots & \ldots & \ldots & \ldots & \ldots \\ w_{m1} & w_{m2} & w_{m3} & \ldots & w_{mn} \end{bmatrix} = [y_1 \ y_2 \ y_3 \ \ldots \ y_n]$$

where $$y_i = \sum_{r=1}^{m} x_r w_{ri} \, (i = 1, 2, \ldots n)$$

An example of such a device, but not limited to it, can be the matrix multiplication block from Google TPU [1].

Matrix-Matrix Multiplication (MMM) block is the device for matrix multiplication of the matrix Xmxk by the matrix Wkxn, where the number of columns (k) of the matrix X is equal to the number of rows of the matrix W: XW=Y $$\begin{bmatrix} x_{11} & x_{12} & x_{13} & \ldots & x_{1k} \\ x_{21} & x_{22} & x_{23} & \ldots & x_{2k} \\ x_{31} & x_{32} & x_{33} & \ldots & x_{3k} \\ \ldots & \ldots & \ldots & \ldots & \ldots \\ x_{m1} & x_{m2} & x_{m3} & \ldots & x_{mk} \end{bmatrix} \begin{bmatrix} w_{11} & w_{12} & w_{13} & \ldots & w_{1n} \\ w_{21} & w_{22} & w_{23} & \ldots & w_{2n} \\ w_{31} & w_{32} & w_{33} & \ldots & w_{3n} \\ \ldots & \ldots & \ldots & \ldots & \ldots \\ w_{k1} & w_{k2} & w_{k3} & \ldots & w_{kn} \end{bmatrix} =$$

$$\begin{bmatrix} y_{11} & y_{12} & y_{13} & \ldots & y_{1n} \\ y_{21} & y_{22} & y_{23} & \ldots & y_{2n} \\ y_{31} & y_{32} & y_{33} & \ldots & y_{3n} \\ \ldots & \ldots & \ldots & \ldots & \ldots \\ y_{m1} & y_{m2} & y_{m3} & \ldots & y_{mn} \end{bmatrix}$$

where $$y_{ij} = \sum_{r=1}^{k} x_{ir} w_{rj} \, (i = 1, 2, \ldots, m; \, j = 1, 2, \ldots n)$$

An example of such a device is "Optical matrix-matrix multiplication method shown by the use of a multifocus hololens" [3].

Hadamard Product (HP) is the device performing element-wise multiplication of matrices with the same dimensions: X·W=Y, where $y_{ij}=x_{ij}w_{ij}$, for any i and j:

$$\begin{bmatrix} x_{11} & x_{12} & \ldots & x_{1n} \\ x_{21} & x_{22} & \ldots & x_{2n} \\ \ldots & \ldots & \ldots & \ldots \\ x_{m1} & x_{m2} & \ldots & x_{mn} \end{bmatrix} \circ \begin{bmatrix} w_{11} & w_{12} & \ldots & w_{1n} \\ w_{21} & w_{22} & \ldots & w_{2n} \\ \ldots & \ldots & \ldots & \ldots \\ w_{m1} & w_{m2} & \ldots & w_{mn} \end{bmatrix} =$$

$$\begin{bmatrix} (x_{11}w_{11}) & (x_{12}w_{12}) & \ldots & (x_{1n}w_{1n}) \\ (x_{21}w_{21}) & (x_{22}w_{22}) & \ldots & (x_{2n}w_{2n}) \\ \ldots & \ldots & \ldots & \ldots \\ (x_{m1}w_{m1}) & (x_{m2}w_{m2}) & \ldots & (x_{mn}w_{mn}) \end{bmatrix} = \begin{bmatrix} y_{11} & y_{12} & \ldots & y_{1n} \\ y_{21} & y_{22} & \ldots & y_{2n} \\ \ldots & \ldots & \ldots & \ldots \\ y_{m1} & y_{m2} & \ldots & y_{mn} \end{bmatrix}$$

Matrix Addition (MA) is preferably the device for element-by-element addition of matrices with the same dimensions:

$X+W=Y$, where $y_{ij}=x_{ij}+w_{ij}$, for any $i$ and $j$:

$$\begin{bmatrix} x_{11} & x_{12} & \ldots & x_{1n} \\ x_{21} & x_{22} & \ldots & x_{2n} \\ \ldots & \ldots & \ldots & \ldots \\ x_{m1} & x_{m2} & \ldots & x_{mn} \end{bmatrix} \rightarrow \begin{bmatrix} w_{11} & w_{12} & \ldots & w_{1n} \\ w_{21} & w_{22} & \ldots & w_{2n} \\ \ldots & \ldots & \ldots & \ldots \\ w_{m1} & w_{m2} & \ldots & w_{mn} \end{bmatrix} =$$

$$\begin{bmatrix} (x_{11}+w_{11}) & (x_{12}+w_{12}) & \ldots & (x_{1n}+w_{1n}) \\ (x_{21}+w_{21}) & (x_{22}+w_{22}) & \ldots & (x_{2n}+w_{2n}) \\ \ldots & \ldots & \ldots & \ldots \\ (x_{m1}+w_{m1}) & (x_{m2}+w_{m2}) & \ldots & (x_{mn+}w_{mn}) \end{bmatrix} = \begin{bmatrix} y_{11} & y_{12} & \ldots & y_{1n} \\ y_{21} & y_{22} & \ldots & y_{2n} \\ \ldots & \ldots & \ldots & \ldots \\ y_{m1} & y_{m2} & \ldots & y_{mn} \end{bmatrix}$$

Finally, Matrix Determinant calculation (MD) is the device which calculates the determinant of a selected matrix.

It should be understood by a person skilled in the art, that the listed devices are not an exhaustive list of all devices utilized by the matrix processing unit and designed for matrix calculations. However, any other/additional device should be connected to a common MDB, that is, to work with a common matrix memory and a common data format. In addition, all these devices must be controlled by the CC with a set of predefined commands.

The described MPU provides computing resources for massively parallel matrix calculations of basic types, which makes the device not only an exceptionally fast processor, but also universal, and suitable for a wide range of tasks.

BRIEF DESCRIPTION OF THE DRAWINGS

The invention is illustrated by way of examples which are not a limitation, and the figures of the accompanying drawings in which references denote corresponding parts, and in which:

FIG. 1 shows the principal architecture of the Matrix Processing Unit (MPU) in accordance with the preferred embodiment of the present invention, in which VMM means Vector-Matrix Multiplication; MMM means Matrix-Matrix Multiplication; HP means Hadamard Product; MA means Matrix Addition; MD means Matrix Determinant calculation; SAM means Slice Access Memory; MDB means Matrix Data Bus; CC means Central Controller; IO means Input/Output block; EDB means External Data Bus; and Instr means Instruction stream.

FIG. 2 shows the preferred embodiment of the Slice Access Memory (SAM).

FIG. 3 shows a memristor crossbar.

FIGS. 14(a) and 14(b) show separation of the matrix in photochromic SAM into negative and positive components by slices; where FIG. 14(a) shows a slice for storing negative values, and FIG. 14(b) shows a slice for storing positive values.

FIG. 15 shows VMM based on DMD-chip.

DETAILED DESCRIPTION

As shown in FIG. 1 and in accordance with the preferred embodiment of the present invention, the Matrix Processing Unit (MPU) preferably includes a three-dimensional Slice Access Memory block (SAM) for storing and processing data in matrix form; an Input/Output block (IO) for accumulating and formatting data into a format acceptable to SAM; a Vector-Matrix Multiplication block (VMM); a Matrix-Matrix Multiplication block (MMM); a Hadamard Product block (HP); a Matrix Addition block (MA); a Matrix Determinant calculation block (MD); a Matrix Data Bus (MDB); a Central Controller (CC); and an External Data Bus (EDB). While the functions performed by each of these blocks is described in detail below, it should be understood by a person skilled in the art that at least some of the data manipulations performed by the VMM, MMM, HP and MA blocks can be performed within SAM itself.

It should be further understood by a person skilled in the art that additional blocks/devices can be utilized within the architecture of the MPU of the present invention.

Slice Access Memory (SAM)

A prerequisite for coordinated and maximally efficient operation of all devices included in the described Matrix Processing Unit (MPU) is the use of a special type of non-volatile fast 3D-memory that provides read/write access simultaneously to the whole matrix.

Even though SAM can be constructed utilizing ordinary DRAM, DRAM is volatile, and consumes energy even at the absence of memory operations. This results in significant power consumption. This configuration would also require to save and load memory each time processor power is turned off.

Further, the architecture of DRAM allows the use of only a small number of channels in parallel, making it slow. Non-volatile flash memory is not quite suitable for building SAM, since it can fail due to a large number of read/write cycles, which is unacceptable when working with a processor.

Memristor SAM

Figure 4:
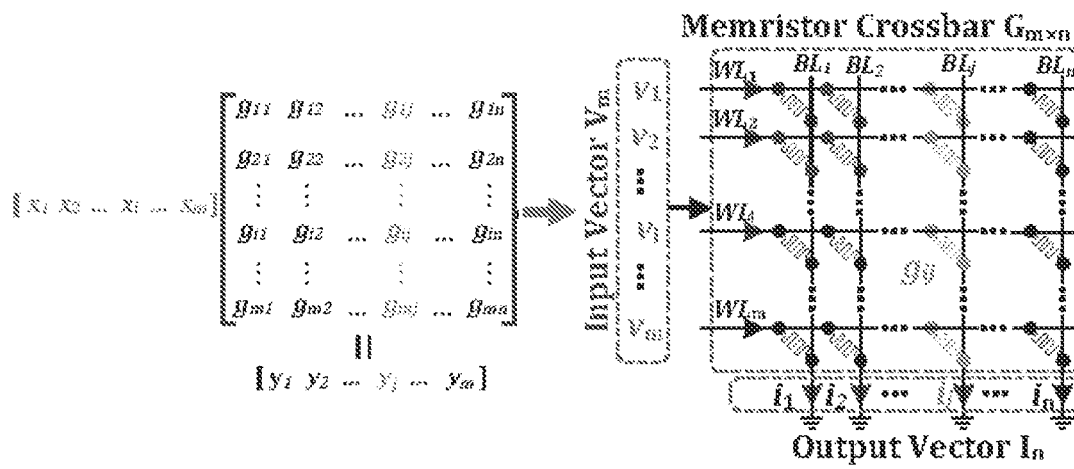
FIG. 4 shows Vector-Matrix Multiplication using the memristor crossbar.

A seemingly suitable base for building SAM are non-volatile, energy-saving memristors with an almost unlimited tolerance for read/write cycles. A typical memristor crossbar, shown in FIG. 3, fits SAM building requirements for the memory. It has been shown repeatedly (Reference [4]) that the memristor crossbar is capable of producing Vector-Matrix Multiplication (FIG. 4).

Figure 5:
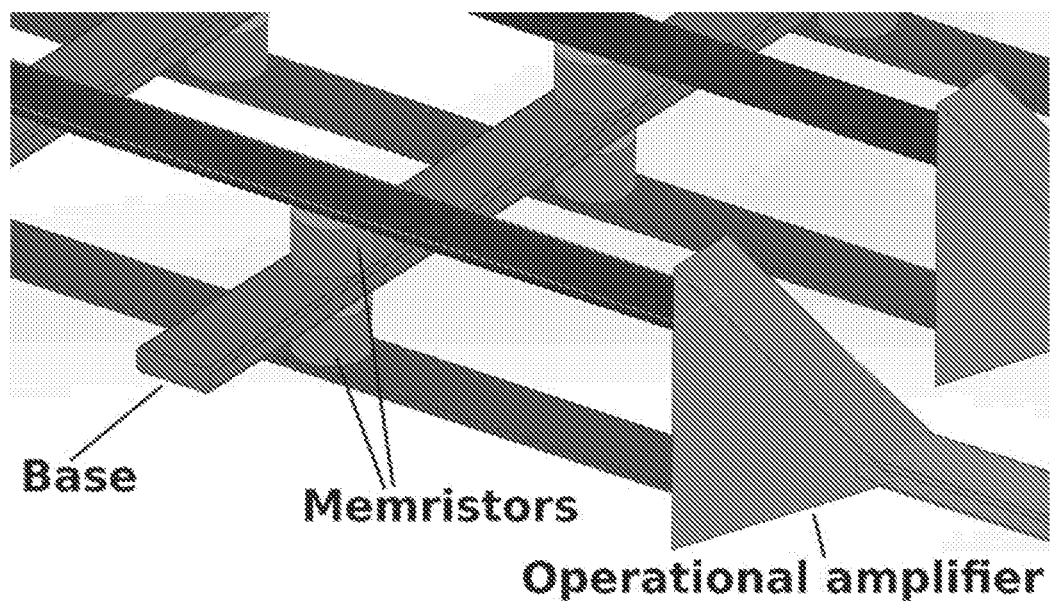
FIG. 5 shows Bipolar Memristors with a common Base for storing values with different signs.
Figure 6:
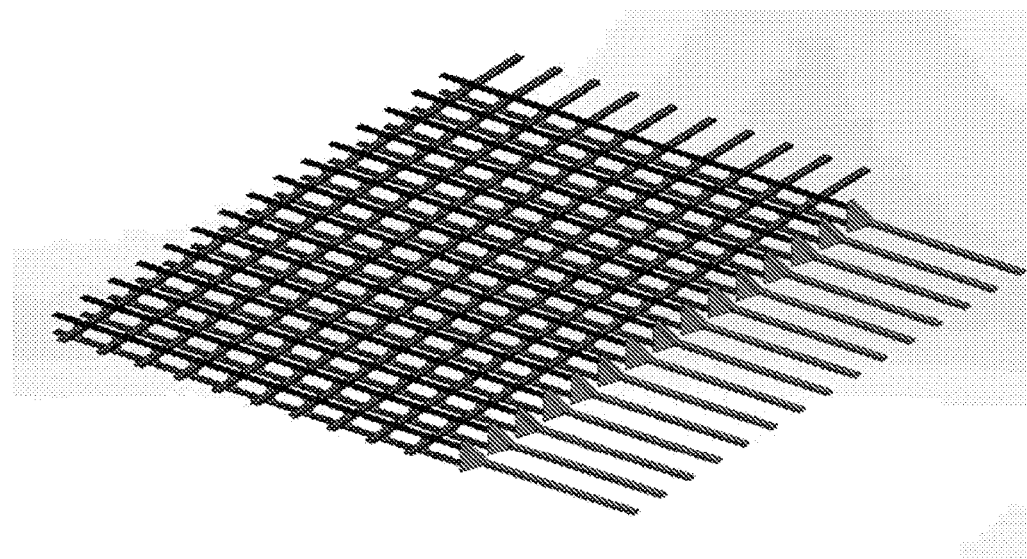
FIG. 6 shows a memristor crossbar two-layer architecture for storing values with different signs.

However, this approach requires storage of both positive and negative values, which are controlled by the opposite polarity of the voltage. This can be accomplished by using a two-layer architecture, as shown in FIG. 5, with a common base (Base) for both layers, where polarity of the voltage is opposite for memristors of different layers. Currents from the common base are passed through opposite memristors ("positive" and "negative") along the corresponding circuits to the operational amplifier, where their difference is calculated and the output is given as the result. Such dual memristor crossbar allows Vector-Matrix Multiplication to be implemented with both positive and negative values (FIG. 6). One basic circuit would be considered a single vector in this memory.

Figure 7:
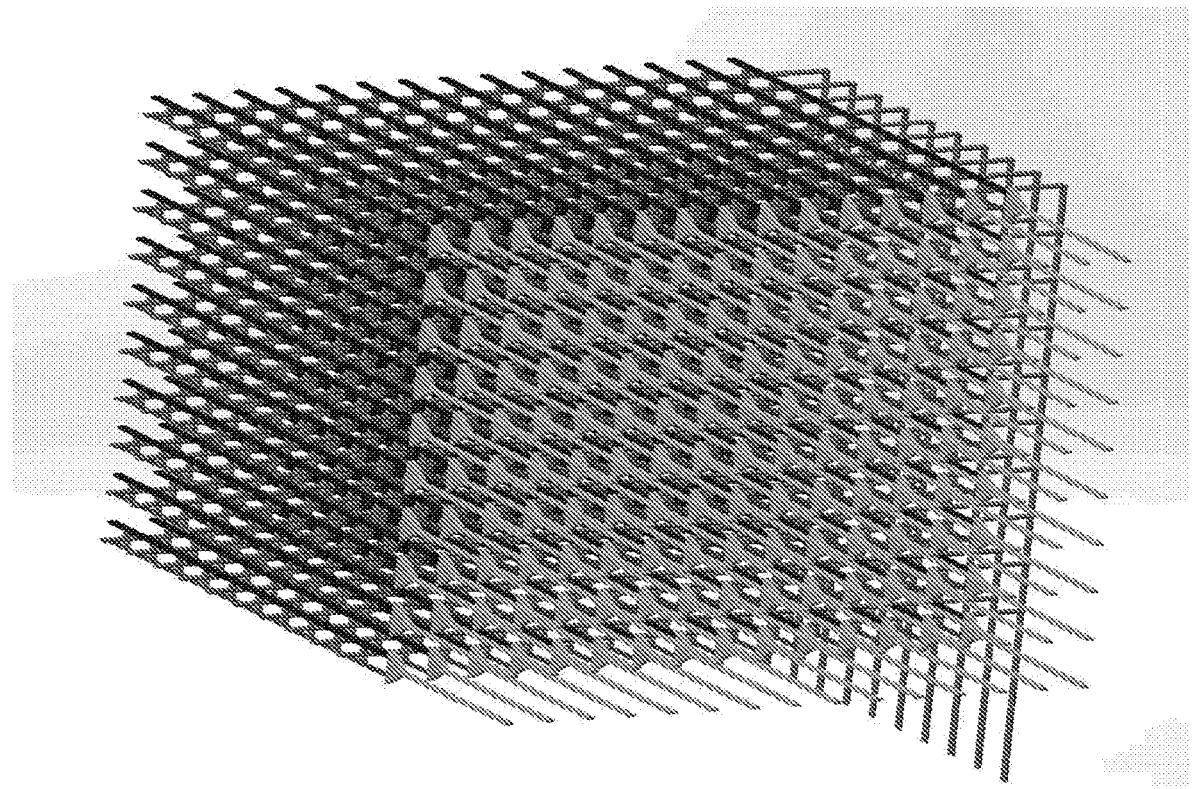
FIG. 7 shows a Memristor based Slice Access Memory (SAM) 3D Model.

Building a multi-layer architecture from the same memristor crossbar layers (FIG. 7) allows for implementation of the required nonvolatile fast 3D-Slice Access Memory (SAM). One common core chain is at all layers of such memory, allowing to address not only the vector but the whole matrix.

The main disadvantage of this approach is the main feature of the memristor itself, i.e., the effect on the resistance of the memristor applied to the memristor voltage. Each operation of reading the resistance of the memristor leads to its change and requires periodic regeneration of the initial state. All this complicates the practical use of memristors as a matrix memory.

Photo-Memristor

Figure 8A:
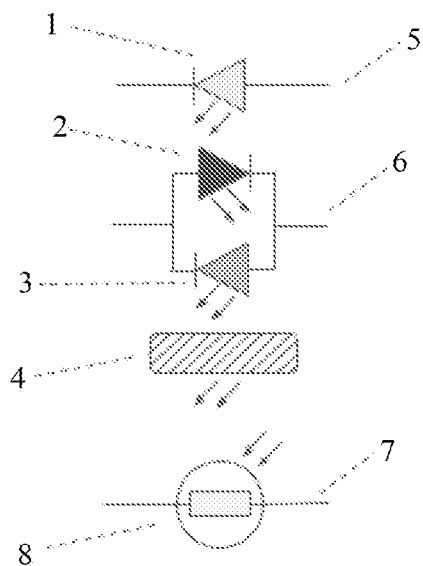
FIG. 8(a) shows a Photo-Memristor based on photoresistor.
Figure 8B:
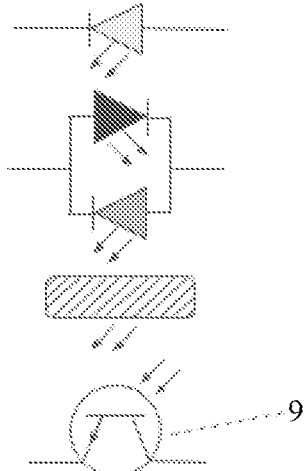
FIG. 8(b) shows a Photo-Memristor based on a phototransistor.

To eliminate the issues of memristor-based SAM, the proposed system separates the recording and the reading processes as illustrated in FIG. 8, in which 1 designates a light source; 2 designates a light source for increasing fluorescence; 3 designates a light source for decreasing fluorescence; 4 designates a layer of photochromic substance; 5 designates a reading mode circuit; 6 designates a recording mode circuit; 7 designates a circuit for reading the resistance level; 8 designates a photoresistor; and 9 designates a phototransistor.

In this embodiment, the non-volatile memory medium is a layer of photochromic substance 4 fluorescing under the influence of illumination at a certain wavelength emitted by the light source 1. The light from the fluorescence of photochrom 4 falls on a resistive element whose resistance depends on the intensity of the light. A photo-resistive element can be, for example, a photoresistor 8 in FIG. 8a, or a phototransistor 9 in FIG. 8b. The fluorescence level of photochrom 4 is controlled by two different wavelengths, one of which converts the photochrom into a fluorescent state, while the other suppresses fluorescence. LEDs 2 and 3 are the sources of the rising and lowering emitting. Moreover, LEDs 2 and 3 are connected to the same circuit in parallel, but with the opposite polarity. Thus, the supply of voltage to the circuit 6 leads, in the case of one polarity, to the emission of only the fluorescence-increasing light, and for the opposite polarity of the voltage, to the emission of only the fluorescence-reducing light. This makes the device similar to an ordinary memristor in effect.

However, unlike an ordinary single-chain memristor, the proposed device contains three circuits: 5, 6 and 7, where circuit 5 is designed for read mode, causing fluorescence of photochromic 4; circuit 6 is designed for recording mode, increasing or decreasing the fluorescence level of photochrom 4, depending on the polarity of the voltage on the circuit 6; and circuit 7 is designed to read the resistance level of the resistive element 8 or 9. Separation of work into independent read and write modes eliminates the shortcomings of the memristors described above, but allows usage of the proposed photo-memristor in circuits designed for an ordinary memristor.

In spite of the described advantages of a photo-memristor, it has some limitations. The energy consumption of a photo-memristor can exceed the energy consumption of an ordinary memristor, since in an ordinary memristor the energy is expended only on the transmission of currents through the memristors themselves, but, in the photo-memristor, the energy is also expended on the illumination of the photochrom.

Photochromic SAM

Figure 9:
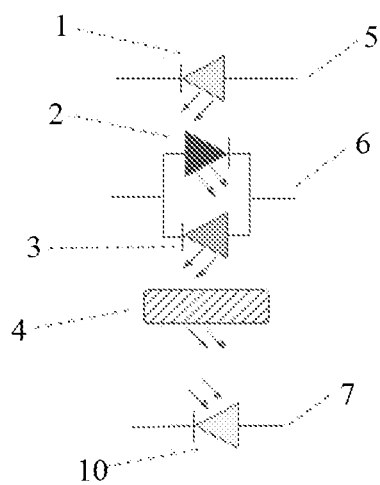
FIG. 9 shows element of photochromic memory.

To reduce energy consumption of Photo-Memristor SAM, the SAM architecture can be based on pairing a light source with memory and light receiver. An example of such a pair may be a pair of a photochrom and a photodiode. Photochrom is preferably a light source with memory, and the photodiode transforms light into electro-currents, as a light receiver, as shown in FIG. 9. The proposed memory element is very similar to the photo-memristor (FIG. 8a, b), in which the resistive element (8) or (9) is replaced by a photocell, for example, a photodiode or a phototransistor (10) in FIG. 9. The circuit (7), in such photochromic memory element, is no longer designed to read the resistance level of a resistive element, but to read the currents generated by the photodiode (10) when the light energy is converted from the fluorescence of photochrom (4) to the electric current. The purpose and functions of the LEDs (1), (2), (3), as well as the circuits (5) and (6) remain the same as in the photo-memristor. In this case the energy is expended only on the illumination of photochromes. In principle, the electric energy obtained by the circuit (7) can be recycled and the energy costs can be further reduced.

Another example of the source and the receiver of light may be photoactive organic field-effect transistors (OFETs)—light-emitting organic field-effect transistors (LE-OFETs) and light-receiving organic field-effect transistors (LR-OFETs). LE-OFETs can function as non-volatile optical memories, and LR-OFETs, as phototransistors.

Figure 10:
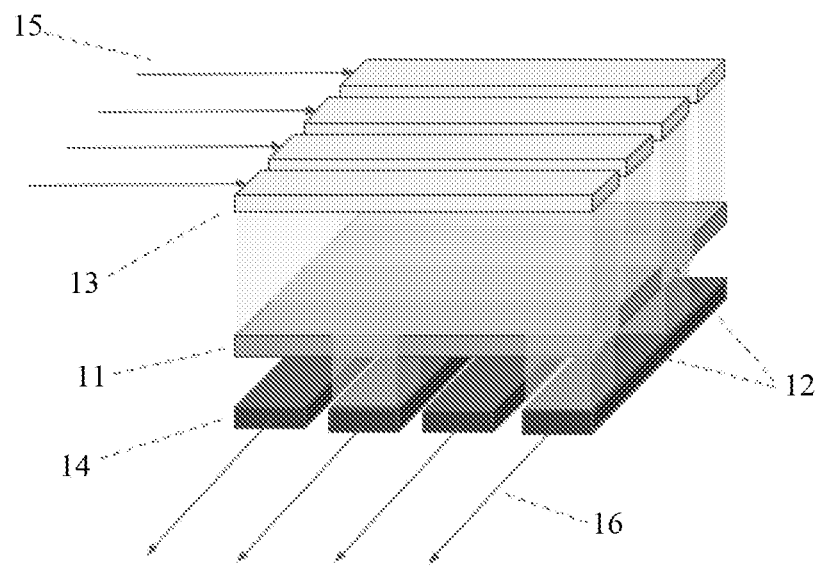
FIG. 10 shows photochromic SAM.

As shown in FIG. 10, reading of information recorded on a photochromic film (11) in the form of fluorescing with different intensity of pixels (12) is preferably carried out using a crossbar of multiple strips of light sources (13) and perpendicular bands of photodiodes (14). The light sources (13) fed through the circuits (15) illuminate the photochromic film (11) causing the fluorescence of pixels (12), where the light falls on the photodiode (14) bands and get converted into electric currents transmitted along the circuits (16). As with the memristor crossbar, the proposed memory based on photochromes allows its user to read an entire vector at once, by feeding power to one of the circuits (15). As with the memristor crossbar, the proposed photochromic SAM allows the vector to be multiplied by the matrix when the voltages are applied to a group of circuits (15). In this case, the input vector is the signal vector of the circuits (15), and the matrix is the matrix of fluorescent pixels (12) on the photochromic film (11). Each band of photodiodes (14) automatically sums the incoming light of the fluorescent pixels (12). The currents from all the photodiode bands (14) form the output vector of the values.

Photochromic SAM (FIG. 10) can be built not only on the basis of fluorescence, but also on the basis of controlled transparency. In this case, the light from the sources (1) modulated by a matrix of pixels with different transparency (12) on the photochromic film (11) will fall on the photodiode bands (14), where its summation and transformation into electric current takes place.

Figure 11:
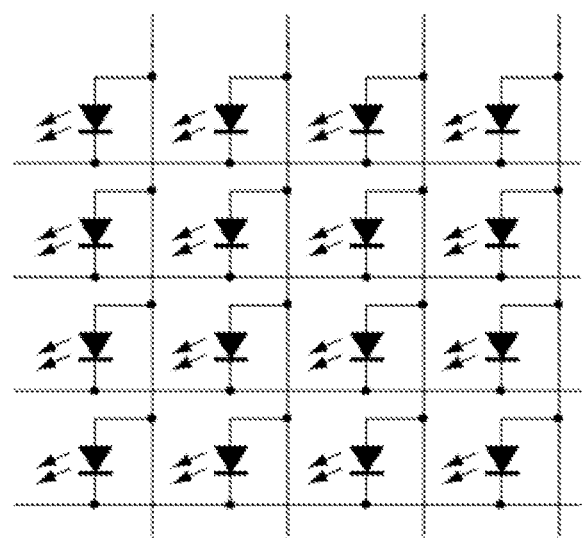
FIG. 11 shows the Passive-Matrix OLED.

For example, the recording of information on a photochromic film can be performed using a simple Passive-Matrix LED/OLED (FIG. 11), where the LEDs emit a wave that changes the fluorescence level of the photochrom. Since it is required not only to increase the fluorescence, but also to decrease it, LEDs emitting light that exert the opposite effect on the photochromic are used. As can be seen in FIG. 9, the LEDs (2) and (3) are connected in parallel to the same circuit, but with the opposite polarity.

Figure 12:
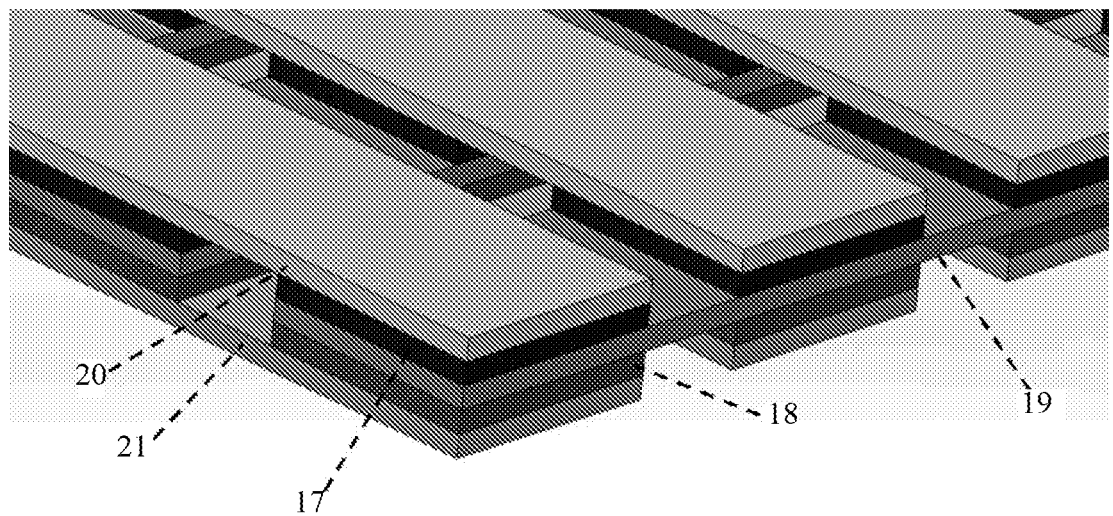
FIG. 12 shows a double crossbar of the recording layer of photochromic SAM

The simplest implementation of such a circuit for a recording layer is a double crossbar, as shown in FIG. 12, where (17) and (18) are LEDs that have the opposite effect on photochrom. The circuit (19) is common to the LEDs (17) and (18), which are connected to this circuit in parallel, but with opposite polarity. In the circuits (20) and (21), the connection of the LEDs (17) and (18) is controlled. Each individual pixel can produce either "positive" (fluorescence-increasing photochromes) or "negative" (fluorescence-lowering photochromes) light, with different intensities.

The formation of a multilayer structure (FIG. 2) from the layer described above makes it possible to construct a Photochromic SAM.

Optical Summators in Photochromic SAM

Figure 29:
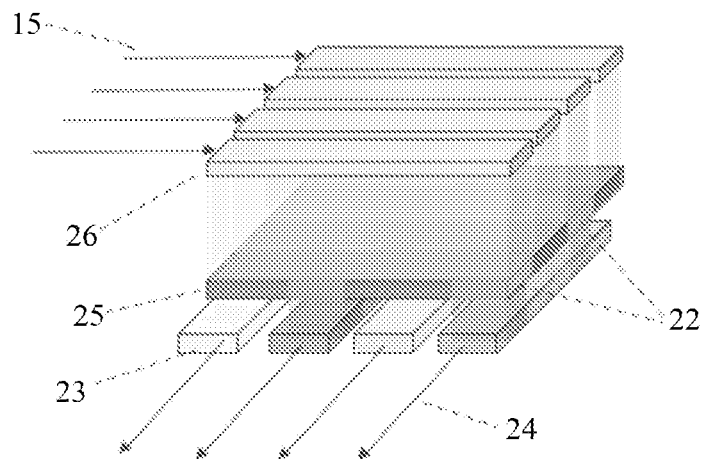
FIG. 29 shows an embodiment of the present invention where summation of light signals is carried out by optical concentrators.

Summation of light signals can be carried out not only by semiconductor (photodiode) circuits (14) shown in FIG. 10, but also by optical concentrators, for example, based on a fluorescent optical fiber, as shown in FIG. 29.

The light from the fluorescent photochrom (22) falls on the fluorescent optical fiber (23) and is partially converted by it into fluorescence of the optical fiber itself. Further, the light propagates through the fiber. Thus, the light from the fluorescent photochrom (22), concentrated along the entire length of the fiber, is summed in it and arrives at the output as a total light signal (24).

Figure 30:
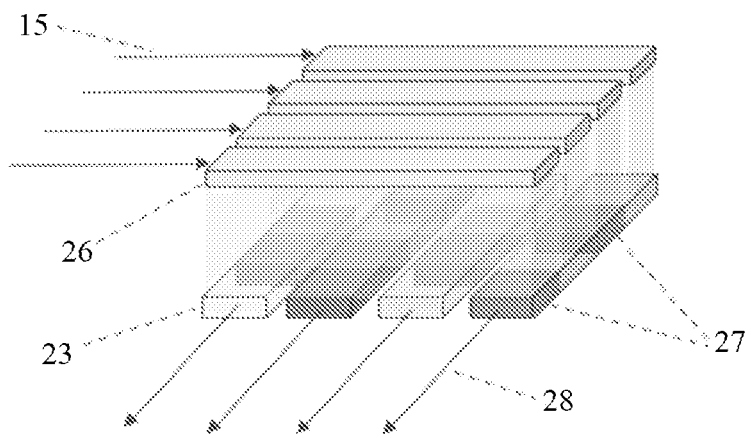
FIG. 30 shows the embodiment of FIG. 29, where functions of the photochromic memory layer and the optical concentrators are combined.

Functions of the photochromic memory layer (25) and the optical concentrators can be combined using a fluorescent photochrome as the material of the optical concentrator, as shown in FIG. 30. In this case, the role of memory elements can be performed by the fiber itself (23). Illumination of such a fiber with a modifying light will cause a change in the fluorescence in different parts of the fiber. Further illumination of such a fiber with fluorescence light (26) will result in fluorescent concentration of different potency (27) in different areas of the fiber. Thus, the multiplication and summation of the signals will be carried out simultaneously by the photochromic fluorescent fiber (23). As a result, the resulting light output signal (28) is formed. The use of such transformation and concentration of light allows us to simplify the architecture of the device, without the use of the photochrome memory layer, that will lead to a reduction in the number of steps of light conversion and, consequently, to a sharp increase in energy efficiency.

Information Coding

Positional Coding

To encode numeric data, it is proposed to use a positional coding system, in which the number is represented in the form of a sum of digits multiplied by the corresponding position parameter. For example, a number consisting of the digits a, b, c, and d:

$$abcd = a_3b_2c_1d_0 = a\eta^3 + b\eta^2 + c\eta^1 + d\eta^0,$$

where $\eta$—base of the numeral system (note that $a_3b_2c_1d_0$ represents a sequence of digits, not multiplication). This approach allows to store in memory any number in the form of a vector, regardless of the amount of information stored in one memory cell[0]. For example, for[2] the decimal number system $618 = 6_2 1_1 8_0 = 6 \cdot 10^2 + 1 \cdot 10^1 + 8 \cdot 10^0$, and three cells with values of 6, 1 and 8 will be occupied in memory. Binary encoding in this case will not differ from usual computer binary coding. The power of number of position parameters is conditional. For example, for nonnegative powers (from 0 and above) integers are encoded. For negative powers of the lower position parameters, real numbers are encoded. For example, $6.18 = 6_0 1_{-1} 8_{-2} = 6 \cdot 10^0 + 1 \cdot 10^{-1} + 8 \cdot 10^{-2}$.

Analog Positional Accumulation

With positional coding, analog summation is performed for digits with an equal digit:

$$a_3b_2c_1d_0 + e_3f_2g_1h_0 = (a\eta^3 + b\eta^2 + c\eta^1 + d\eta^0) + (e\eta^3 + f\eta^2 + g\eta^1 + h\eta^0) = (a+e)\eta^3 + (b+f)\eta^2 + (c+g)\eta^1 + (d+h)\eta^0$$

Analog Positional Multiplication

With positional coding, analog multiplication is performed for numbers like Matrix-Matrix Multiplication for two vectors of digits, forming a multiplication matrix:

$$a_3b_2c_1d_0 \cdot e_3f_2g_1h_0 =$$
$$(a\eta^3 + b\eta^2 + c\eta^1 + d\eta^0) \cdot (e\eta^3 + f\eta^2 + g\eta^1 + h\eta^0) == ae \cdot \eta^6 + af \cdot \eta^5 +$$
$$ag \cdot \eta^4 + ah \cdot \eta^3 + be \cdot \eta^5 + bf \cdot \eta^4 + bg \cdot \eta^3 + bh \cdot \eta^2 + ce \cdot \eta^4 +$$
$$cf \cdot \eta^3 + cg \cdot \eta^2 + ch \cdot \eta^1 + de \cdot \eta^3 + df \cdot \eta^2 + dg \cdot \eta^1 + dh \cdot \eta^0 +$$

where the multiplied digital factors can be represented in the form of a matrix product:

$$\begin{bmatrix} a & 0 & 0 & 0 \\ b & 0 & 0 & 0 \\ c & 0 & 0 & 0 \\ d & 0 & 0 & 0 \end{bmatrix} \begin{bmatrix} e & f & g & h \\ 0 & 0 & 0 & 0 \\ 0 & 0 & 0 & 0 \\ 0 & 0 & 0 & 0 \end{bmatrix} = \begin{bmatrix} ae & af & ag & ah \\ be & bf & bg & bh \\ ce & cf & cg & ch \\ de & df & dg & dh \end{bmatrix}$$

In this case, the positions, with the corresponding matrix multipliers, form the matrix of the power degrees:

$$\begin{bmatrix} 6 & 5 & 4 & 3 \\ 5 & 4 & 3 & 2 \\ 4 & 3 & 2 & 1 \\ 3 & 2 & 1 & 0 \end{bmatrix}$$

Figure 31:
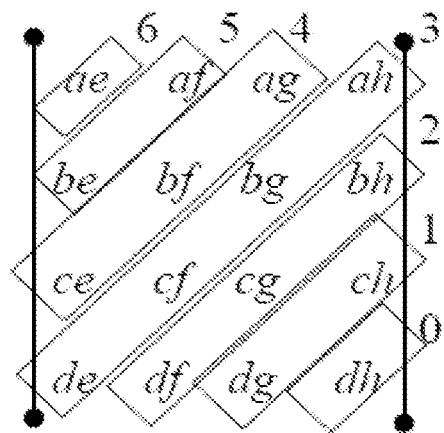
FIGS. 31-39 illustrate matrix calculations.

It can be seen that the degrees are arranged along parallel diagonal lines, which allows an analogue summation of multipliers of the multiplication matrix, as seen in FIG. 31.

The result of such analog summation is already very close to the normal form of positional coding:

$$a_3b_2c_1d_0 \cdot e_3f_2g_1h_0 = = ae \cdot \eta^6 + (be + af) \cdot \eta^5 + (ce + bf + ag)$$
$$\cdot \eta^4 + (de + cf + bg + ah) \cdot \eta^3 + (df + cg + bh) \cdot \eta^2 + (dg + ch)$$
$$\cdot \eta^1 + dh \cdot \eta^0$$

It remains only to convert the multipliers represented by the analog sums to the positional form and perform the positional summation.

For example, in decimal notation: 124·3118=386632. We represent the product in the proposed matrix form:

$$\begin{bmatrix} 0 & 0 & 0 & 0 \\ 1 & 0 & 0 & 0 \\ 2 & 0 & 0 & 0 \\ 4 & 0 & 0 & 0 \end{bmatrix} \begin{bmatrix} 3 & 1 & 1 & 8 \\ 0 & 0 & 0 & 0 \\ 0 & 0 & 0 & 0 \\ 0 & 0 & 0 & 0 \end{bmatrix} = \begin{bmatrix} 0 & 0 & 0 & 0 \\ 3 & 1 & 1 & 8 \\ 6 & 2 & 2 & 16 \\ 12 & 4 & 4 & 32 \end{bmatrix}$$

Figure 32:
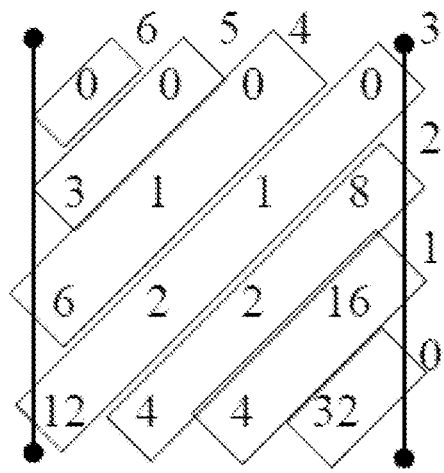

Now add the factors with equal positions (diagonals), as seen in FIG. 32.

$$0 \cdot 10^6 + (3+0) \cdot 10^5 + (6+1+0) \cdot 10^4 + (12+2+1+0) \cdot 10^3 + (4+2+8) \cdot 10^2 + (4+16) \cdot 10^1 + 32 \cdot 10^0 = 0 + 300000 + 70000 + 15000 + 1400 + 200 + 32 = 386632$$

We have come to the right result.

The proposed mechanism for multiplying numbers can be implemented analogously and executed in one step. This mechanism is naturally implemented in some of the above MPU devices, for example, the matrix-to-matrix multiplication block (MMM).

As an example, we multiply two matrices with three-digit numbers in the decimal number system:

$$A = \begin{bmatrix} 32 & 131 & 5 \\ 102 & 2 & 33 \\ 78 & 246 & 15 \end{bmatrix} \text{ and } B = \begin{bmatrix} 1 & 72 & 233 \\ 12 & 33 & 201 \\ 14 & 43 & 179 \end{bmatrix}$$

$$C = A \times B = \begin{bmatrix} 32 & 131 & 5 \\ 102 & 2 & 33 \\ 78 & 246 & 15 \end{bmatrix} \begin{bmatrix} 1 & 72 & 223 \\ 12 & 33 & 201 \\ 14 & 43 & 179 \end{bmatrix} = \begin{bmatrix} 1674 & 6842 & 34362 \\ 588 & 8829 & 29055 \\ 3240 & 14379 & 69525 \end{bmatrix}$$

The numbers are encoded positionally, as was shown above. Moreover, the vectors of the numbers of the matrix A will be located in the columns, and the vectors of the numbers of $$C = A \times B = \begin{bmatrix} 0 & 1 & 0 \\ 3 & 3 & 0 \\ 2 & 1 & 5 \\ \\ 1 & 0 & 0 \\ 0 & 0 & 3 \\ 2 & 2 & 3 \\ \\ 0 & 2 & 0 \\ 7 & 4 & 1 \\ 8 & 6 & 5 \end{bmatrix} \begin{bmatrix} 001 & 072 & 223 \\ 012 & 033 & 201 \\ 014 & 043 & 179 \end{bmatrix} =$$

the matrix B will be located in the rows:

$$= \begin{bmatrix} 0 & 1 & 2 & 0 & 3 & 3 & 2 & 0 & 1 \\ 0 & 3 & 9 & 0 & 30 & 15 & 12 & 6 & 12 \\ 0 & 6 & 24 & 0 & 37 & 22 & 11 & 39 & 52 \\ \\ 0 & 0 & 1 & 0 & 7 & 2 & 2 & 2 & 3 \\ 0 & 3 & 12 & 0 & 12 & 9 & 3 & 21 & 27 \\ 0 & 5 & 18 & 0 & 32 & 19 & 11 & 25 & 35 \\ \\ 0 & 2 & 4 & 0 & 6 & 6 & 4 & 0 & 2 \\ 0 & 5 & 19 & 0 & 65 & 29 & 23 & 21 & 34 \\ 0 & 11 & 40 & 0 & 94 & 49 & 33 & 51 & 75 \end{bmatrix}$$

Figure 33:
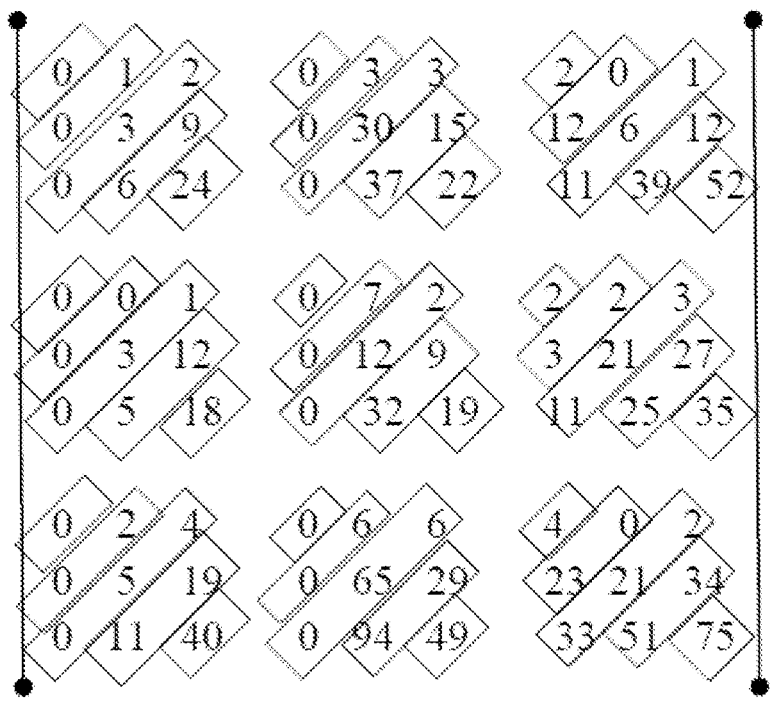
Figure 34:
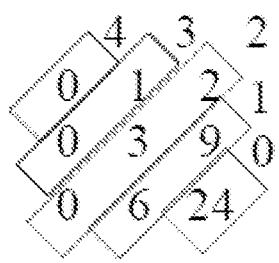
Figure 35:
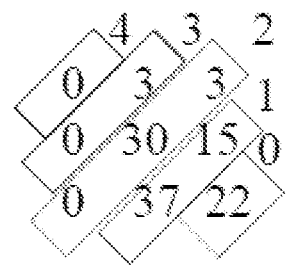

The result is a 9×9 matrix shown in FIG. 33, or a 3×3 matrix consisting of 3×3 submatrices, each of which encodes an individual number of the resulting matrix.

where for a submatrix shown in FIG. 34,
We add the factors with equal positions (diagonals):

$0 \cdot 10^4 + (0 \pm 1) \cdot 10^3 + (0+3+2) \cdot 10^2 + (6+9) \cdot 10^1 + 24 \cdot 10^0 = 0 + 1000 + 500 + 150 + 24 = 1674$ For the submatrix shown in FIG. 35,
We add the factors with equal positions (diagonals):

$0 \cdot 10^4 + (0+3) \cdot 10^3 + (0+30+3) \cdot 10^2 + (37+15) \cdot 10^1 + 22 \cdot 10^0 = 0 + 3000 + 3300 + 520 + 22 = 6842$ Folding the obtained matrix, we get a result analogous to that obtained by the usual multiplication:

$$\begin{bmatrix} 1674 & 6842 & 34362 \\ 588 & 8829 & 29055 \\ 3240 & 14379 & 69525 \end{bmatrix}$$

Encoding Negative Values

In connection with the features of the analog implementation of matrix calculations in the described MPU, the coding of negative values will differ from the methods used in classical computers.

Since direct analog calculations in the proposed device are performed only with absolute values, it is necessary to separate the positive and negative values and perform these calculations separately.

Separate positive and negative values can be either in space or in time.

Figure 13:
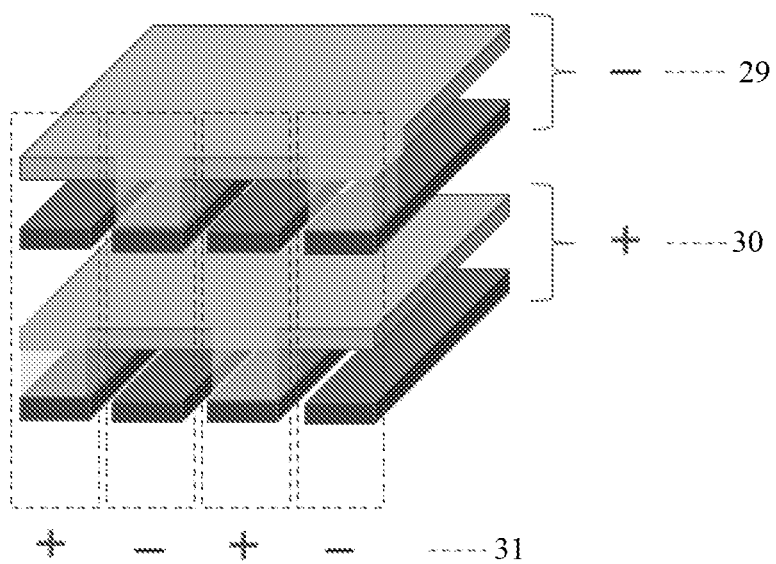
FIG. 13 shows a layered separation of the matrix in photochromic SAM into negative and positive components.

Separation in space:

Independent parallel SAM layers are preferably utilized for this function. In SAM, positive storing layers preferably alternate with negative storing layers. As shown in FIG. 13, this structure enables the device to divide the matrices containing arbitrary numbers by the negative and positive components. In FIG. 13, (29) is the layer for storing negative values; (30) is the layer for storing positive values; and (31) is the readable vector from mixed positive and negative values. Only negative values are stored in layer (29) and only positive values are stored in layer (30).

Thus, when reading the vector of values from these two layers, the vector (31) will be read from the alternating positive and negative values.

Computational operations with positive and negative matrix components should be carried out separately, so the matrix of positive and negative values stored in SAM must be divided in space not only by layers, but also by slices, as shown in FIG. 14. Specifically, as explained above, negative values are stored in the layer (29), and positive ones are stored in the layer (30). Thus, as shown in FIG. 14(a), the negative slice (32) of the matrix extracts only negative values. Conversely, as shown in FIG. 14(b), the positive slice (33) of the matrix extracts only positive values. The main disadvantage of the proposed method of separating positive and negative values in space is the lack of compactness.

Separation in time:

The compactness of recording information in SAM can be improved by marking the sign of the value with a flag, just as it is done in modern computers. However, in that case a mechanism for managing access to memory is required, depending on the flag value.

For example, access to the values is via nMOS or pMOS transistors. The Gate signal is fed from the value sign flag. One control signal for SAM, allows access only to values with a positive flag another control signal access only to values with a negative flag set. In this scenario, the separation of matrices into positive and negative components will occur in time, since one-step access to the data will be provided only to either positive or negative values. Calculations with both will need to be performed sequentially.

Another way of separating positive and negative values can be the mixture of photochromes reacting to different wavelengths. Some wavelengths correspond only to negative values, while the others only to positive. This allows to work selectively with information, depending on the conventional sign.

Matrix Addition (MA)

The choice of two or more matrices in SAM simultaneously leads to their automatic summation, thus eliminating necessity to develop a separate device for this purpose.

When adding matrices, negative components add only with negative ones, and positive components only with positive ones. The result is the difference between the positive and negative sums.

Matrix Multiplication (MM)

For multiplication, it is also necessary to separate positive and negative values. As shown above, the matrix must be divided into two matrices, one of which contains only positive values, and the second only negative ones. Multiplication is performed separately for the positive and negative components of both matrices. Thus, there are four independent multiplications: Matrix 1⁺ (positive component of Matrix 1, $\overset{+}{M1}$)

by Matrix 2⁺(positive component of Matrix 2, $\overset{+}{M2}$),

Matrix 1⁻ (negative component of Matrix 1, $\overset{-}{M1}$)

by Matrix 2⁻ (negative component of Matrix 2, $\overset{-}{M2}$), $\overset{+}{M1}$ by $\overset{-}{M2}$, $\overset{-}{M1}$ by $\overset{+}{M2}$.

While, $\overset{+}{M1}$ by $\overset{+}{M2}$ and $\overset{-}{M1}$ by $\overset{-}{M2}$ are the positive component of the resulting matrix, $\overset{+}{M1}$ by $\overset{-}{M2}$ and $\overset{-}{M1}$ by $\overset{+}{M2}$ are the negative component. To calculate the result of matrix multiplication, it is required to subtract its negative component from the positive component of the resulting matrix.

For example, for matrices $$A = \begin{bmatrix} 2 & -3 & 5 \\ 1 & 2 & -3 \\ -7 & 4 & 5 \end{bmatrix} \text{ and } B = \begin{bmatrix} -1 & 7 & 2 \\ -2 & 3 & -2 \\ 4 & -3 & 1 \end{bmatrix}$$

$$C = A \times B = \begin{bmatrix} 2 & -3 & 5 \\ 1 & 2 & -3 \\ -7 & 4 & 5 \end{bmatrix} \begin{bmatrix} -1 & 7 & 2 \\ -2 & 3 & -2 \\ 4 & -3 & 1 \end{bmatrix} = \begin{bmatrix} 24 & -10 & 15 \\ -17 & 22 & -5 \\ 19 & -52 & -17 \end{bmatrix}$$

We divide the matrices A and B into positive and negative components:

$$\overset{+}{A} = \begin{bmatrix} 2 & 0 & 5 \\ 1 & 2 & 0 \\ 0 & 4 & 5 \end{bmatrix}, \overset{-}{A} = \begin{bmatrix} 0 & 3 & 0 \\ 0 & 0 & 3 \\ 7 & 0 & 0 \end{bmatrix}$$

$$\overset{+}{B} = \begin{bmatrix} 0 & 7 & 2 \\ 0 & 3 & 0 \\ 4 & 0 & 1 \end{bmatrix}, \overset{-}{B} = \begin{bmatrix} 1 & 0 & 0 \\ 2 & 0 & 2 \\ 0 & 3 & 0 \end{bmatrix}$$

We obtain the positive components of the matrix C:

$$\overset{+}{C1} = \overset{+}{A} \times \overset{+}{B} = \begin{bmatrix} 2 & 0 & 5 \\ 1 & 2 & 0 \\ 0 & 4 & 5 \end{bmatrix} \begin{bmatrix} 0 & 7 & 2 \\ 0 & 3 & 0 \\ 4 & 0 & 1 \end{bmatrix} = \begin{bmatrix} 20 & 14 & 9 \\ 0 & 13 & 2 \\ 20 & 12 & 5 \end{bmatrix}$$

-continued $$\overset{+}{C2} = \overset{-}{A} \times \overset{-}{B} = \begin{bmatrix} 0 & 3 & 0 \\ 0 & 0 & 3 \\ 7 & 0 & 0 \end{bmatrix} \begin{bmatrix} 1 & 0 & 0 \\ 2 & 0 & 2 \\ 0 & 3 & 0 \end{bmatrix} = \begin{bmatrix} 6 & 0 & 6 \\ 0 & 9 & 0 \\ 7 & 0 & 0 \end{bmatrix}$$

As a result:

$$\overset{+}{C} = \overset{+}{C1} + \overset{+}{C2} = \begin{bmatrix} 20 & 14 & 9 \\ 0 & 13 & 2 \\ 20 & 12 & 5 \end{bmatrix} + \begin{bmatrix} 6 & 0 & 6 \\ 0 & 9 & 0 \\ 7 & 0 & 0 \end{bmatrix} = \begin{bmatrix} 26 & 14 & 15 \\ 0 & 22 & 2 \\ 27 & 12 & 5 \end{bmatrix}$$

The negative components of the matrix C:

$$\overset{-}{C1} = \overset{+}{A} \times \overset{-}{B} = \begin{bmatrix} 2 & 0 & 5 \\ 1 & 2 & 0 \\ 0 & 4 & 5 \end{bmatrix} \begin{bmatrix} 1 & 0 & 0 \\ 2 & 0 & 2 \\ 0 & 3 & 0 \end{bmatrix} = \begin{bmatrix} 2 & 15 & 0 \\ 5 & 0 & 4 \\ 8 & 15 & 8 \end{bmatrix}$$

$$\overset{-}{C2} = \overset{-}{A} \times \overset{+}{B} = \begin{bmatrix} 0 & 3 & 0 \\ 0 & 0 & 3 \\ 7 & 0 & 0 \end{bmatrix} \begin{bmatrix} 0 & 7 & 2 \\ 0 & 3 & 0 \\ 4 & 0 & 1 \end{bmatrix} = \begin{bmatrix} 0 & 9 & 0 \\ 12 & 0 & 3 \\ 0 & 49 & 14 \end{bmatrix}$$

As a result:

$$\overset{-}{C} = \overset{-}{C1} + \overset{-}{C2} = \begin{bmatrix} 2 & 15 & 0 \\ 5 & 0 & 4 \\ 8 & 15 & 8 \end{bmatrix} + \begin{bmatrix} 0 & 9 & 0 \\ 12 & 0 & 3 \\ 0 & 49 & 14 \end{bmatrix} = \begin{bmatrix} 2 & 24 & 0 \\ 17 & 0 & 7 \\ 8 & 64 & 22 \end{bmatrix}$$

And, finally:

$$C = \overset{+}{C} - \overset{-}{C} = \begin{bmatrix} 26 & 14 & 15 \\ 0 & 22 & 2 \\ 27 & 12 & 5 \end{bmatrix} - \begin{bmatrix} 2 & 24 & 0 \\ 17 & 0 & 7 \\ 8 & 64 & 22 \end{bmatrix} = \begin{bmatrix} 24 & -10 & 15 \\ -17 & 22 & -5 \\ 19 & -52 & -17 \end{bmatrix}$$

We have arrived at the same result as in direct multiplication of matrices.

Vector-Matrix Multiplication (VMM)

In addition to devices such as TPU [1] and EnLight256 [2], VMM can be implemented, as shown above, on a single layer memristor crossbar (FIG. 4).

As shown above, the VMM can be implemented on the basis of the crossbar of linear light sources and linear photodiodes, using a photochromic film (as shown in FIG. 10) where an input vector is fed along the chains (15) in FIG. 10. The matrix of fluorescent pixels on the photochromic film (11) plays the role of the input matrix. Light from the sources (13), transforming into fluorescence light on the photochromic film, performs analog multiplication of the individual values of the input vector, on the individual values of the input matrix. The fluorescent light from individual pixels (12) on the photochromic film falls on the photodiode bands (14), where the total conversion of all light into electric currents occurs, resulting in analogous addition of the multiplication results. As shown in FIG. 10, a single layer of SAM is able to perform the Vector-Matrix Multiplication. If there are values with different signs in the input vector and/or input matrix, the multiplication is performed by four independent operations: the positive section of the vector by the positive section of the matrix (the positive component of multiplication), the negative section of the vector by the negative section of the matrix (the positive component of multiplication), the positive section vector by the negative section of the matrix (the negative component of multiplication), the negative section of the vector by the positive section of the matrix (the negative component of multiplication). Further, the sum of the negative components of the multiplication is subtracted from the sum of the positive components of the multiplication, which forms the final result.

As illustrated in FIG. 15, however, the modern element base allows to implement VMM in an alternative embodiment, where the input vector is formed as a light "barcode" on a DMD chip, the speed of which is limited by the speed of micromirrors (it is measured at present in hundreds of KHz). In FIG. 15, OMM is the Optical Matrix Modulator, P is the photodiode adder, L1 is the lens focusing the lines of the input vector, and L2 is the lens focusing the lines of pixels of a modulated optical matrix. The light barcode, in turn, passes through the Optical Matrix Modulator (OMM), which is an input matrix, and is modulated pixel-by-pixel by OMM. Thus, the values of the input vector are multiplied by the values of the input matrix. The result of this multiplication, in the form of a light matrix, falls on the photodiode adder P, consisting of a set of parallel photodiode bands perpendicular to the lines of the light "barcode". As in the case of a photochromic device, photodiodes sum up the light values, and generate the output vector, as the result of VMM. Between OMM and P, a lens L2 can be mounted, which focuses the rows of pixels of the modulated optical matrix into the vector of the individual light points, thereby performing the summation. In this case, photodiode bands are not required, only a vector of individual point photodiodes is needed. In principle, nothing prevents the input matrix from making a DMD chip, and the input vector OMM, modulating the light not in a matrix, but in parallel bands. In this case, the roles of optical modulators change, but the process of VMM remains the same.

Matrix-Matrix Multiplication (MMM)

The complexity of computing VMM by definition is $O(n^2)$, while the complexity of calculating MMM by definition is $O(n^3)$, where n is the dimension of the side of the matrix. Use of unique algorithmic techniques led to reduction of the complexity of MMM in solving practical problems to about $O(n^{2.52})$. Due to the "Coppersmith-Vinograd barrier" in asymptotic estimates of the speed of the algorithms, no further algorithmic increase in the speed of MMM calculation is foreseen. The transition from VMM to MMM means a radical (power-law) increase in the speed of computation.

The SAM architecture of the present invention, for example, based on photochromes, allows not only VMM on a separate layer, but also MMM, when using a multi-layer package, where MMM can be represented as n independent VMMs, the results of which (vectors) are collected in a matrix.

However, with this approach, n identical layers of SAM need to create n identical copies of the same matrix. Only in this case it will apply to MMM. The necessity of creation of preliminary multiple copies of one matrix is the bottleneck of such an approach. It negates the entire gain of time from the speed of calculations by the cost of copying. The Photochromic SAM architecture allows to build a device for MMM, which will copy only one copy of the matrix, where it is necessary, thus eliminating the copying issue.

MMM Using Transparent Modulator

Figure 16:
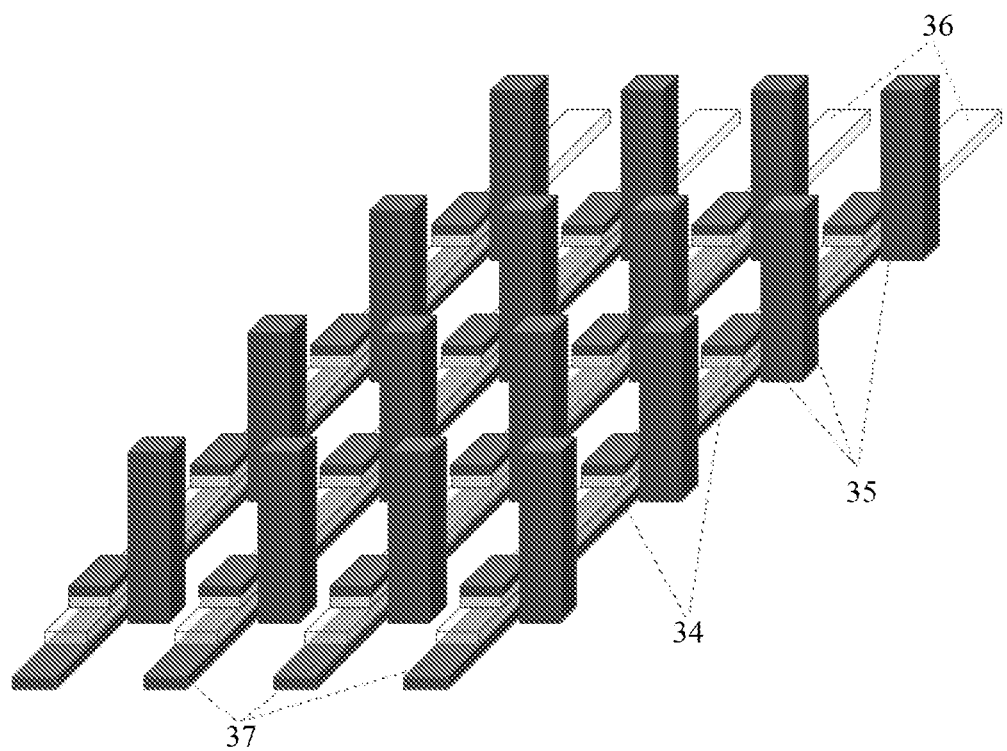
FIG. 16 shows MMM layer on controlled light sources.

If a layer of photochromic substance (11) with fluorescent pixels (12) of FIG. 10 is replaced by a matrix of light sources (for example, LEDs) in a separate layer of Photochromic SAM, where each layer is controlled in a separate circuit in parallel and independent of other light sources, the bands of photodiodes (14) will still add up the light occurrence on them from the LEDs. As shown in FIG. 16, the formed layer of the pixel light sources (34) is fed through the individual circuits (35) located perpendicular to the plane of the layer (vertically). This provides independent and parallel control of the brightness of the pixel light sources (34), connected in parallel to the transparent or non-obstructing ground circuits (36). The light from the light sources (34) falls on the photodiode bands (37) that sum it up.

Figure 17:
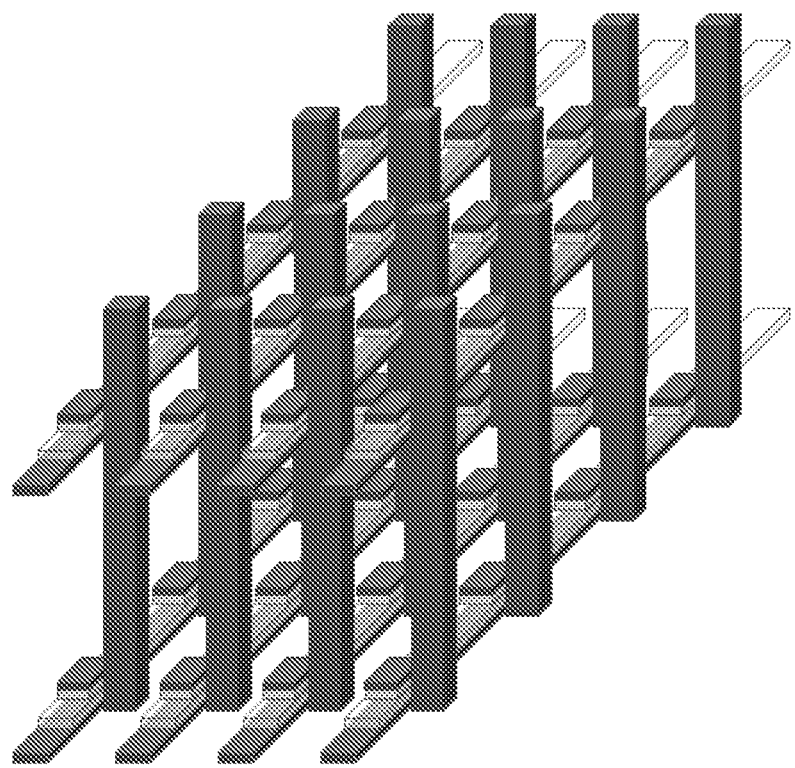
FIG. 17 shows multilayered architecture of MMM on controlled light sources.

The proposed architecture makes it possible to form a multilayer structure, as shown in FIG. 17, in which vertical feeding chains of light sources pass through the entire structure, feeding all layers in parallel and forming identical matrices on top of each layer.

Figure 18:
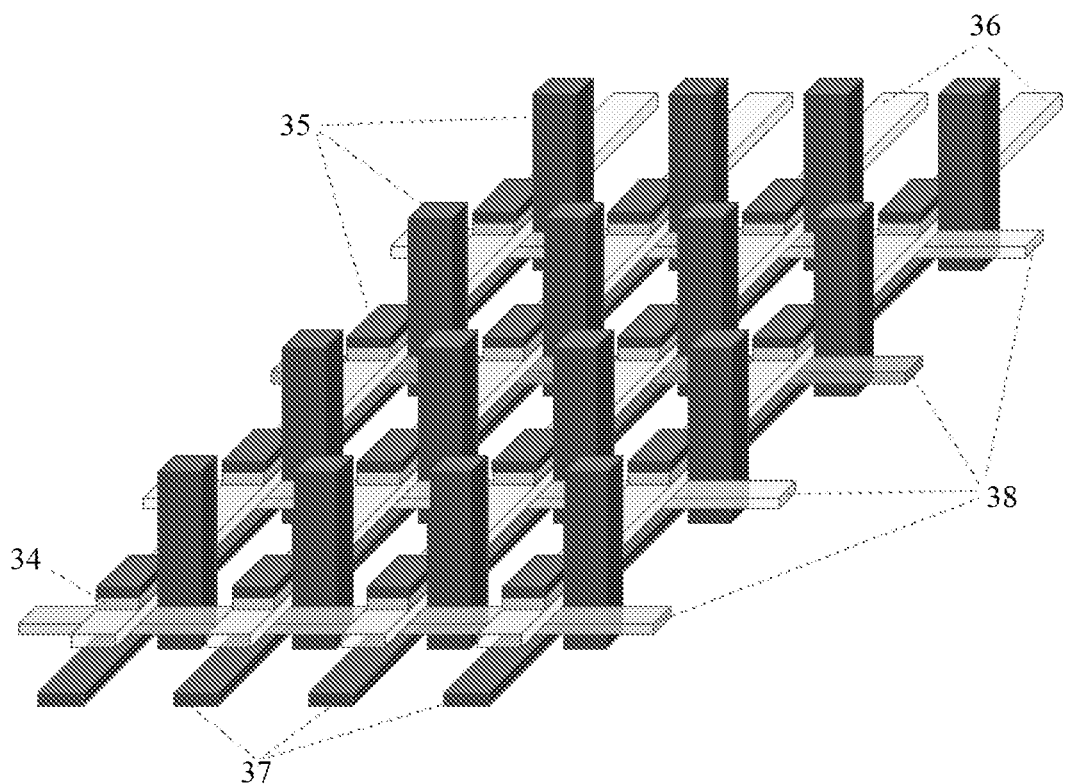
FIG. 18 shows optically modulated layer of MMM on controlled light sources.

However, to multiply a vector by a matrix, it is also necessary to multiply the values of the matrix by the values of the vector, that is, it is necessary to further modulate the luminescence intensity of the pixel light sources, along the lines in the plane of the layer and perpendicular to the photodiode bands. Such modulation can be implemented in various ways. For example, a modulator can be a set of parallel bands with an adjustable transparency (for example, liquid crystal or photochrom), as shown in the embodiment of FIG. 18.

In this embodiment, bands of the optical modulator with an adjustable transparency (38) are located between the grounding circuits (36) of the light sources (34) and the photodiode bands (37), and in the same plane, but perpendicular to the photodiode bands (37). For each band of the optical modulator with adjustable transparency (38) its signal is fed from the input vector, which establishes a certain transparency. Light from the sources (34), passing through the band of the optical modulator (38) actually multiplies the value of the input matrix by the value of the input vector. The modulated light is summed over the photodiode bands. This way VMM is implemented on one MMM layer. As was shown above, a copy of the same input matrix is formed on each layer of such a device, therefore, on each layer, the multiplication of different vectors is performed on the same matrix, resulting in MMM calculation on the described device.

Figure 19:
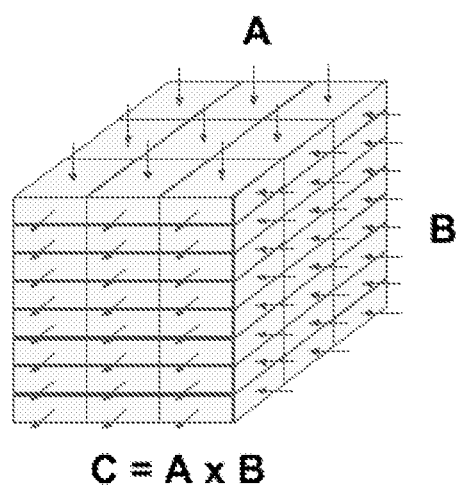
FIG. 19 shows computational parallelepiped MMM.

The described device for calculating the MMM can be represented by a parallelepiped shown in FIG. 19, in which A is the input face of the first matrix to be multiplied, B is the input face of the second matrix to be multiplied, and C is the output face of the matrix resulting from the multiplication. Thus, the two adjacent faces of which (A, B) are fed with the matrices to be multiplied, and the matrix resulting from the multiplication is received from the third adjacent face (C): C=A·B.

MMM Using TFT Modulator

Figure 20:
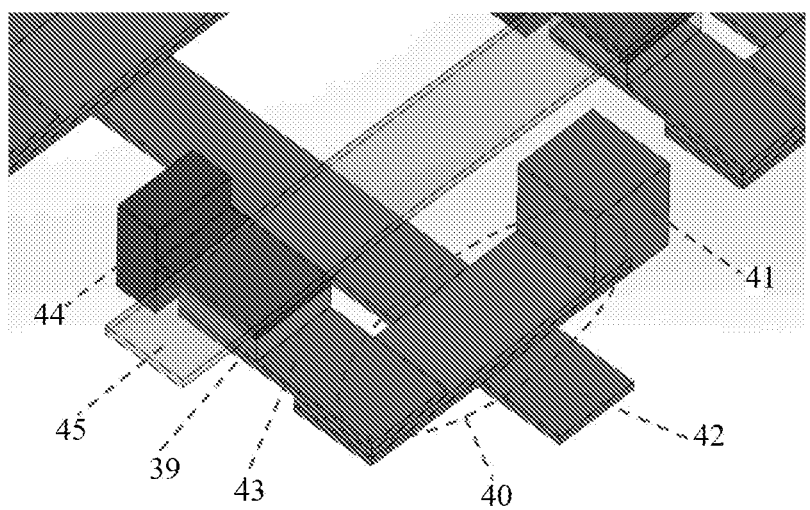
FIG. 20 shows the MMM element on controlled light sources with TFT modulation.

In another preferred embodiment, shown in FIG. 20, modulation of the luminescence intensity of pixel light sources can be accomplished using transistors, such as TFT. In this embodiment, pixel light source (39) is fed via a transistor (40). Power supply to the light sources (39) is fed independently and in parallel through the source, whose circuits (41) are located perpendicular to the plane of the layer (positioned vertically). Through the contact (41), one of the input (multiplied) values, modulated via gate of the transistor (42), is fed to the device. The second of the input (multiplied) values is fed to the device via the contact (42). In fact, the result of multiplying two values on a transistor is supplied via drain (43) to the light source (39). The brightness of the light source (39) depends on this resultant value. Light sources (39) are connected in parallel to the ground circuits (44). The light from the sources (39) falls on the photodiode strip (45) located in the same plane as the gate circuit of the transistor (42), but perpendicular to it.

Figure 21:
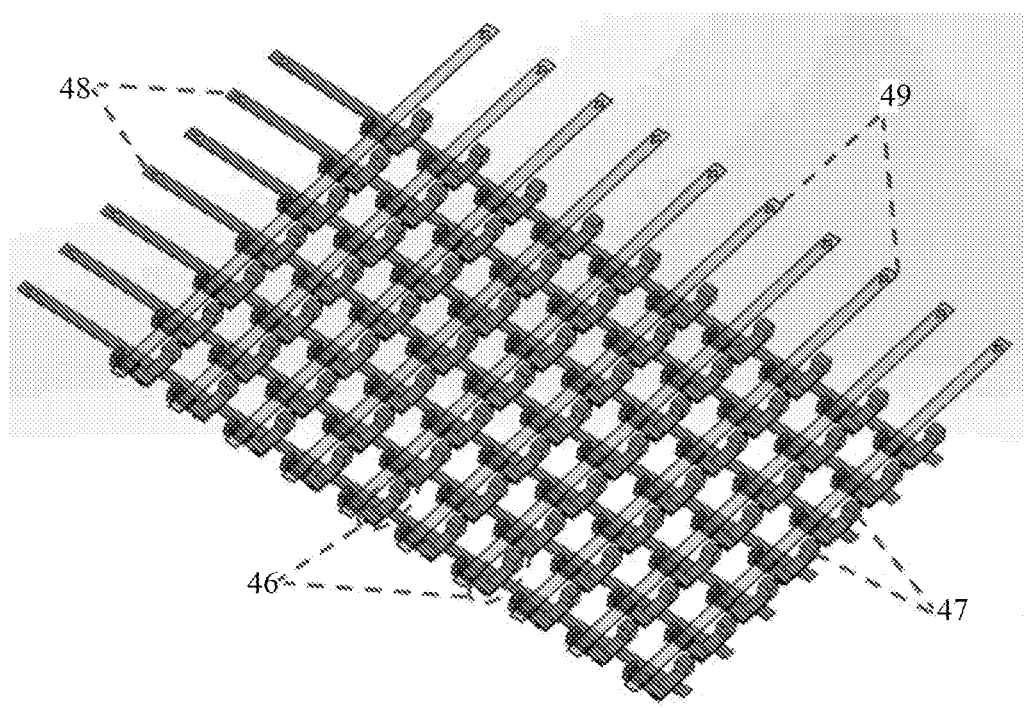
FIG. 21 shows the MMM layer on controlled light sources with TFT modulation.

An array of such nodes forms one layer of the device similar to one layer of Photochromic SAM, as shown in FIG. 21, in which (46) designates the TFTs, (47) designates power supply circuits of light sources, (48) designates the gate of TFT circuits, and (49) designates the summing photodiode strips. Thus, the input (multiplied) matrix of photochromic pixels is replaced by a matrix of transistors (46). Through the transistors (46) via parallel circuits (47) the power is fed on the light sources. In such a way the input (multiplied) matrix is fed. The input (multiplied) vector is fed through the gate circuits of transistors (48). The output vector, as a result of multiplication, is formed on the photodiode bands (49).

Figure 22:
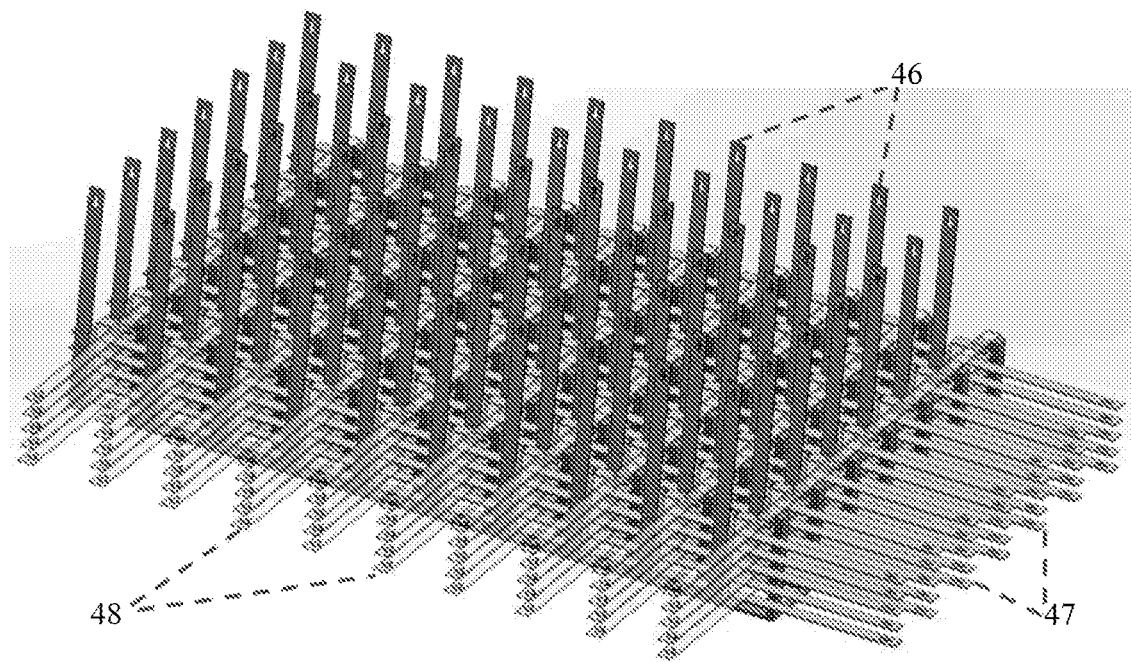
FIG. 22 shows a multilayered architecture of MMM on light sources with modulation on TFT.

Formation of a multilayer structure of layers of FIG. 21 is shown in FIG. 22, where the power supply circuits of light sources (46) are inputs to one multiplied matrix located perpendicular to the layers and in parallel to the connected sources of transistors of similar nodes on different layers. This ensures simultaneous transmission of the first multiplied matrix to all layers. The gates circuits of the transistors of all layers (47) form the inputs for the second matrix to be multiplied. The result of multiplication in the form of a matrix is formed on the summing photodiode bands of all layers (48). A parallelepiped form of the MMM implementation of FIG. 19 is also applicable.

Optical MMM

Figure 23:
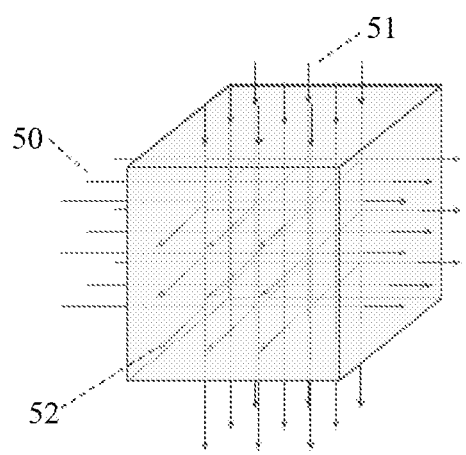
FIG. 23 shows the Optical MMM flow-based concept.

The above-described MMM implementations, both for the Transparent Modulator and for the TFT Modulator, describe the same MMM device concept illustrated in FIG. 23, where the first multiplied matrix (50) is in the form of an array of input streams, the second matrix to be multiplied (51) is in the form of an array of input streams, and the matrix resulting from the multiplication (52) is in the form of an array of output streams. The multiplied matrices are fed into the device as stream arrays perpendicular to each other (50, 51). At points of intersection of two perpendicular flows from different matrices, multiplication of values characterized by flux intensity occurs. The result of multiplication is transferred from the intersection point to the adder and then to the output via the input intersecting multiplied streams (52).

This MMM architecture allows to create a purely optical device for implementing MMM. Specific miniature devices can be used, for example, nano-devices that generate a beam of light only if two beams with certain wavelengths fall at the same time on such nano-device. The intensity of the generated light depends on both beams that fell on this nano-device. This provides multiplication of the two initial values. If a transparent substance is uniformly filled with such optical nano-devices, the resulting optical composite can be used for MMM.

Figure 24:
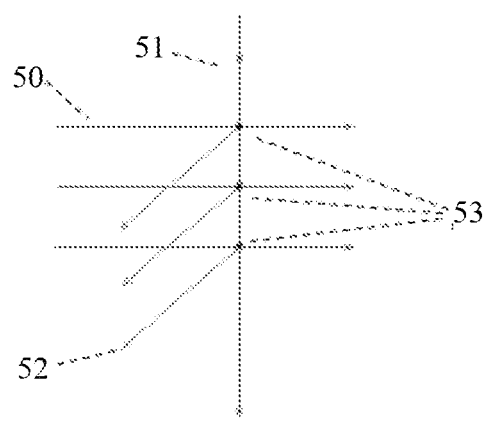
FIG. 24 shows the process of multiplication of values at the intersection points of the rays.

As shown in FIG. 24, only at the points of intersection a new beam (52) perpendicular to the plane of the input beams (50, 51) will be generated on the nano-devices (53) of the input beams of both types (50, 51).

Figure 25:
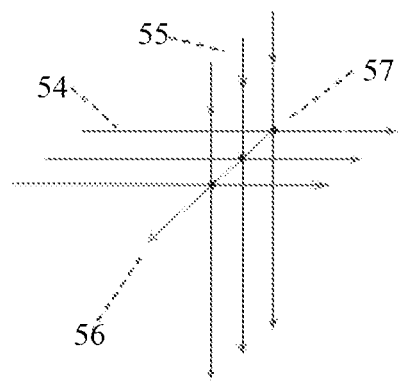
FIG. 25 shows the process of summing up the multiplied values by merging the generated rays.

Similarly, summation of the multiplied values is illustrated in FIG. 25, in which (54) designates the first multiplied value in the form of an input ray, (55) designates the second multiplied value in the form of an input ray, (56) designates the result of multiplication in the form of a generated ray, and (57) designates a binary nano-device that generates a ray when its input rays intersect. Accordingly, summation of the multiplied values occurs when rays of the first type (54) intersect with rays of the second type (55) in such a way that the points of intersection with the optical nano-devices (57) lay on the same straight line. The rays generated by each such intersection point are superimposed on each other, which leads to a summation of their intensities (56). The role of such specific optical nano-devices, can be performed by specially selected Quantum Dots, for example, oriented in space in such a way that, excited by the action of two rays intersecting them, a beam directed perpendicularly to the plane of the input rays.

Hadamard Product (HP)

Figure 26:
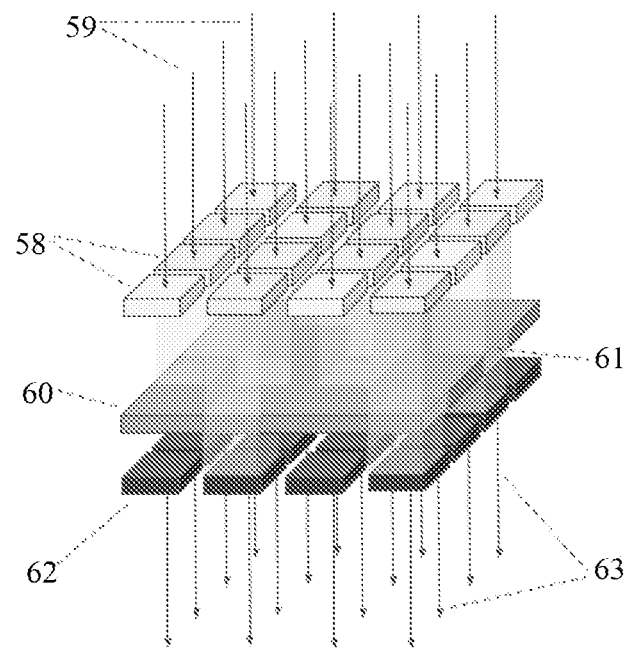
FIG. 26 shows HP based on optical modulation.

For element-by-element multiplication of matrices, optical modulation similar to the one proposed in Photochromic SAM can be used. As illustrated in FIG. 26, light sources (58), such as LEDs, are controlled in parallel and independent of each other along the circuits (59). Light from the pixel sources (58) forming one of the multiplied element matrices falls on the optical matrix modulator (60). It modulates the light pixel by pixel. The optical matrix modulator (60) can be implemented in various ways. The main thing is that each pixel (61) modulates the brightness of the light from the light source (58) and thus multiplies the values of the individual pixels from both matrices. Such an optical modulator can be, for example, a matrix on liquid crystals, where the transparency of each pixel can be specified. An optical modulator based on the controlled transparency of individual pixels can be implemented based on a photochromic layer similar to the one suggested above for Photochromic SAM. Photochromic optical modulator can be realized not only on the basis of controlled transparency, but also on the basis of controlled fluorescence. The light from each pixel (61) of the optical matrix modulator (60) falls on the photodiode (62) of the photodiode array and, on parallel circuits (63), returning the result of HP.

For the multiplication of numbers in the positional coding, the method of analogous digit multiplication proposed above can be used. However, in order not to use the complex MMM 3D model proposed above for computing HP (FIG. 26), each number is encoded not by an individual pixel, but by a square submatrix, where the vector encoding the number by the corresponding positions are repeated as many times as many positions are used. This is done both for the matrix of light sources (58) and for the matrix of the optical modulator (60). A prerequisite is the perpendicularity of the arrangement of vectors in different layers of the device.

For example, for the product abcd·efgh, matrices will be used:

$$\begin{bmatrix} a & a & a & a \\ b & b & b & b \\ c & c & c & c \\ d & d & d & d \end{bmatrix} \text{ and } \begin{bmatrix} e & f & g & h \\ e & f & g & h \\ e & f & g & h \\ e & f & g & h \end{bmatrix}$$

As a result of the proposed device for calculating HP of FIG. 26, at the output, for the proposed two matrices encoding the position multipliers, the resultant matrix looks like this:

$$\begin{bmatrix} a & 0 & 0 & 0 \\ b & 0 & 0 & 0 \\ c & 0 & 0 & 0 \\ d & 0 & 0 & 0 \end{bmatrix} \begin{bmatrix} e & f & g & h \\ 0 & 0 & 0 & 0 \\ 0 & 0 & 0 & 0 \\ 0 & 0 & 0 & 0 \end{bmatrix} = \begin{bmatrix} ae & af & ag & ah \\ be & bf & bg & bh \\ ce & cf & cg & ch \\ de & df & dg & dh \end{bmatrix}$$

The result does not differ from the analogous position multiplication method proposed above. From the matrix obtained by summation over the diagonals, the result of multiplying the original numbers is obtained.

Example of multiplying two matrices with three-digit numbers in the decimal number system:

$$A = \begin{bmatrix} 32 & 131 & 5 \\ 102 & 2 & 33 \\ 78 & 246 & 15 \end{bmatrix} \text{ and } B = \begin{bmatrix} 1 & 72 & 223 \\ 12 & 33 & 201 \\ 14 & 43 & 179 \end{bmatrix}$$

$$C = A \circ B = \begin{bmatrix} 32 & 131 & 5 \\ 102 & 2 & 33 \\ 78 & 246 & 15 \end{bmatrix} \circ \begin{bmatrix} 1 & 72 & 223 \\ 12 & 33 & 201 \\ 14 & 43 & 179 \end{bmatrix} =$$

$$\begin{bmatrix} [32 \cdot 1] & [131 \cdot 72] & [5 \cdot 223] \\ [102 \cdot 12] & [2 \cdot 33] & [33 \cdot 201] \\ [78 \cdot 14] & [246 \cdot 43] & [15 \cdot 179] \end{bmatrix} = \begin{bmatrix} 32 & 9432 & 1115 \\ 1224 & 66 & 6633 \\ 1092 & 10578 & 2685 \end{bmatrix}$$

It is necessary to represent the matrices A and B in the proposed positional coding with duplication of the digit vectors:

$$A = \begin{bmatrix} 0 & 0 & 0 & 1 & 1 & 1 & 0 & 0 & 0 \\ 3 & 3 & 3 & 3 & 3 & 3 & 0 & 0 & 0 \\ 2 & 2 & 2 & 1 & 1 & 1 & 5 & 5 & 5 \\ 1 & 1 & 1 & 0 & 0 & 0 & 0 & 0 & 0 \\ 0 & 0 & 0 & 0 & 0 & 0 & 3 & 3 & 3 \\ 2 & 2 & 2 & 2 & 2 & 2 & 3 & 3 & 3 \\ 0 & 0 & 0 & 2 & 2 & 2 & 0 & 0 & 0 \\ 7 & 7 & 7 & 4 & 4 & 4 & 1 & 1 & 1 \\ 8 & 8 & 8 & 6 & 6 & 6 & 5 & 5 & 5 \end{bmatrix},$$

$$B = \begin{bmatrix} 0 & 0 & 1 & 0 & 7 & 2 & 2 & 2 & 3 \\ 0 & 0 & 1 & 0 & 7 & 2 & 2 & 2 & 3 \\ 0 & 0 & 1 & 0 & 7 & 2 & 2 & 2 & 3 \\ 0 & 1 & 2 & 0 & 3 & 3 & 2 & 0 & 1 \\ 0 & 1 & 2 & 0 & 3 & 3 & 2 & 0 & 1 \\ 0 & 1 & 2 & 0 & 3 & 3 & 2 & 0 & 1 \\ 0 & 1 & 4 & 0 & 4 & 3 & 1 & 7 & 9 \\ 0 & 1 & 4 & 0 & 4 & 3 & 1 & 7 & 9 \\ 0 & 1 & 4 & 0 & 4 & 3 & 1 & 7 & 9 \end{bmatrix}$$

Then:

$$C = A \circ B = \begin{bmatrix} 0 & 0 & 0 & 1 & 1 & 1 & 0 & 0 & 0 \\ 3 & 3 & 3 & 3 & 3 & 3 & 0 & 0 & 0 \\ 2 & 2 & 2 & 1 & 1 & 1 & 5 & 5 & 5 \\ 1 & 1 & 1 & 0 & 0 & 0 & 0 & 0 & 0 \\ 0 & 0 & 0 & 0 & 0 & 0 & 3 & 3 & 3 \\ 2 & 2 & 2 & 2 & 2 & 2 & 3 & 3 & 3 \\ 0 & 0 & 0 & 2 & 2 & 2 & 0 & 0 & 0 \\ 7 & 7 & 7 & 4 & 4 & 4 & 1 & 1 & 1 \\ 8 & 8 & 8 & 6 & 6 & 6 & 5 & 5 & 5 \end{bmatrix} \circ$$

$$\begin{bmatrix} 0 & 0 & 1 & 0 & 7 & 2 & 2 & 2 & 3 \\ 0 & 0 & 1 & 0 & 7 & 2 & 2 & 2 & 3 \\ 0 & 0 & 1 & 0 & 7 & 2 & 2 & 2 & 3 \\ 0 & 1 & 2 & 0 & 3 & 3 & 2 & 0 & 1 \\ 0 & 1 & 2 & 0 & 3 & 3 & 2 & 0 & 1 \\ 0 & 1 & 2 & 0 & 3 & 3 & 2 & 0 & 1 \\ 0 & 1 & 4 & 0 & 4 & 3 & 1 & 7 & 9 \\ 0 & 1 & 4 & 0 & 4 & 3 & 1 & 7 & 9 \\ 0 & 1 & 4 & 0 & 4 & 3 & 1 & 7 & 9 \end{bmatrix} ==$$

$$\begin{bmatrix} 0 & 0 & 0 & 0 & 7 & 2 & 0 & 0 & 0 \\ 0 & 0 & 3 & 0 & 21 & 6 & 0 & 0 & 0 \\ 0 & 0 & 2 & 0 & 7 & 2 & 10 & 10 & 15 \\ 0 & 1 & 2 & 0 & 0 & 0 & 0 & 0 & 0 \\ 0 & 0 & 0 & 0 & 0 & 0 & 6 & 0 & 3 \\ 0 & 2 & 4 & 0 & 6 & 6 & 6 & 0 & 3 \\ 0 & 0 & 0 & 0 & 8 & 6 & 0 & 0 & 0 \\ 0 & 7 & 28 & 0 & 16 & 12 & 1 & 7 & 9 \\ 0 & 8 & 32 & 0 & 24 & 18 & 5 & 35 & 45 \end{bmatrix}$$

Figure 36:
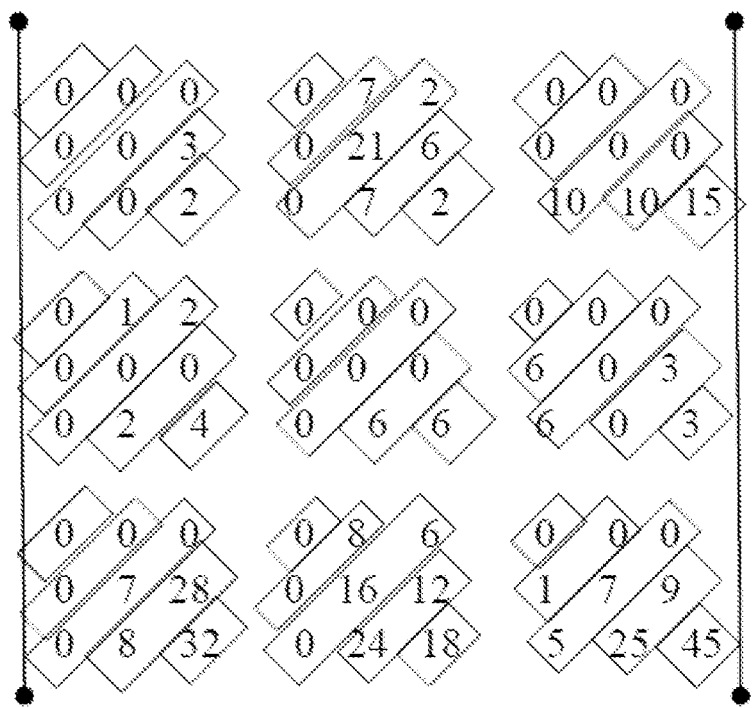
Figure 37:
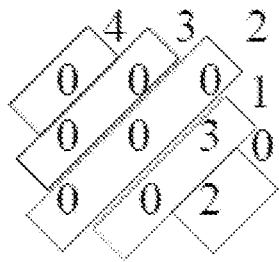
Figure 38:
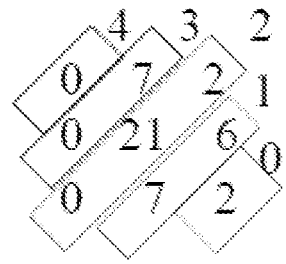
Figure 39:
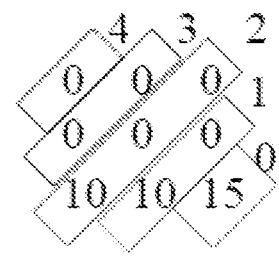

The result is a 9×9 matrix shown in FIG. 36 or a 3×3 matrix consisting of 3×3 submatrices, each of which encodes an individual number of the resulting matrix, where for submatrix shown in FIG. 37, add the factors with equal positions (diagonals):

$0 \cdot 10^4 + (0+0) \cdot 10^3 + (0+0+0) \cdot 10^2 + (0+3) \cdot 10^1 + 2 \cdot 10^0 = 0+0+0+30+2 = 32$ For submatrix shown in FIG. 38, add the factors with equal positions (diagonals):

$0 \cdot 10^4 + (0+7) \cdot 10^3 + (0+21+2) \cdot 10^2 + (7+6) \cdot 10^1 + 2 \cdot 10^0 = 0++7000+2300+130+2 = 9432$ For submatrix shown in FIG. 39, we add the factors with equal positions (diagonals):

$0 \cdot 10^4 + (0+0) \cdot 10^3 + (10+0+0) \cdot 10^2 + (10+0) \cdot 10^1 + 15 \cdot 10^0 = 0+0+1000+100+15 = 1115$ Folding the calculated matrix, we obtain a result similar to that obtained by the conventional HP:

$$\begin{bmatrix} 32 & 9432 & 1115 \\ 1224 & 66 & 6633 \\ 1092 & 10578 & 2685 \end{bmatrix}$$

Matrix Interface

Figure 27:
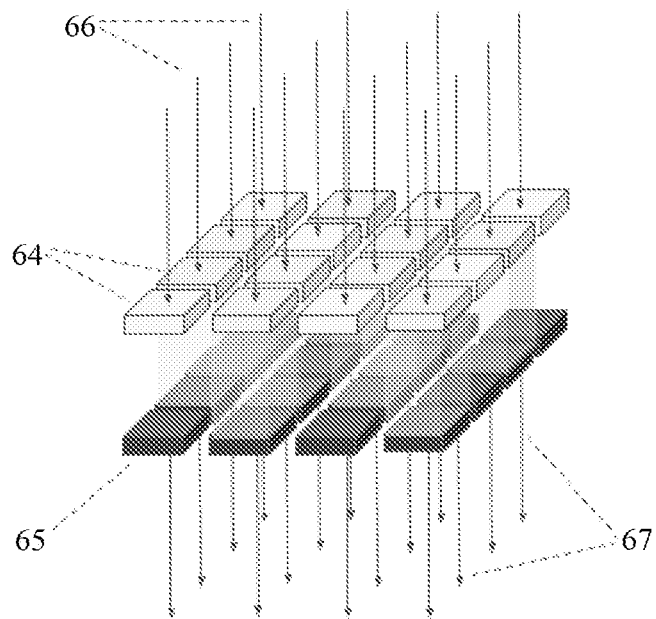
FIG. 27 shows an Optical Matrix Interface.

Matrix Data Bus (MDB), Matrix memory (SAM) and matrix computing devices (such as VMM, MMM, MA, HP, etc.) will not function without the ability to provide them with the necessary information from the outside. It is necessary to provide a fast method of transferring the original matrices into and within the Matrix Processing Unit (MPU) and of extracting the results of matrix calculations. One possible method for providing a fast interface for the MPU can be a device built using matrices and light like all other sub-units of the MPU. It is proposed to share/mix light source matrices, for example, based on OLED, Quantum Dots or LE-OFETs, and photodetectors matrices, for example, based on photodiodes or LR-OFETs. As shown in FIG. 27, the transmitting device transmits information via the light sources (64) to an external device that receives information via the matrix of photodiodes (65). The light sources (64) are controlled via parallel independent matrix source circuits (66). The information is read by an external device through parallel matrix receiver circuits (67).

Figure 28:
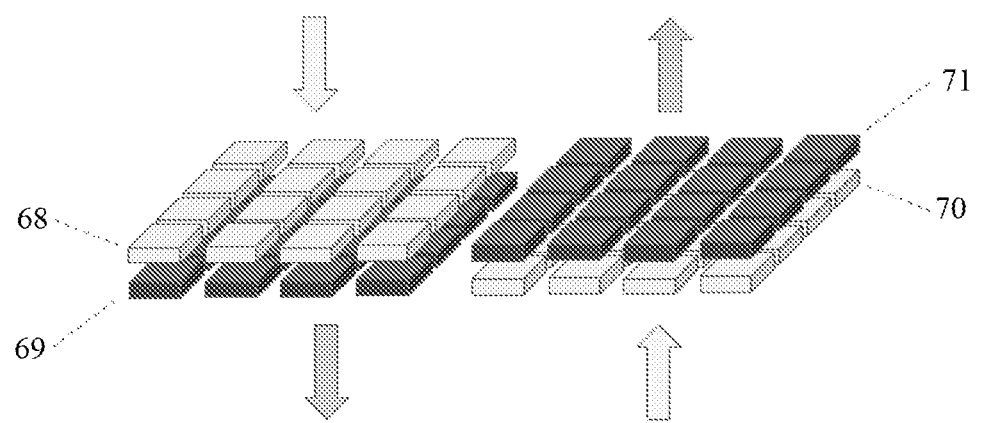
FIG. 28 shows a Two-way Optical Matrix Interface.

To ensure two-way information transfer, both sides include both a radiating matrix and a light-receiving matrix, for example, a photodiode array, as shown in FIG. 28. The MPU transmits information externally by forming a light image on the LED array (68). The external, i.e., second, device receives information via its photodiode array (69). The reverse transfer of information occurs in exactly the same way, i.e., the external device transmits information through its own matrix of LEDs (70), and the MPU receives information through its matrix of photodiodes (71).

Central Controller

Central Controller (CC) is a device that provides programmatic control of the IO, SAM, and all of the matrix conversion devices. Control is performed by a stream of instructions coming from an instructions data bus (Instr) separately from the External Data Bus (EDB), where matrix data to be processed is transmitted through EDB. Unlike other MPU devices, CC can be implemented on a digital serial architecture. To provide multi-thread management, the MPU CC can have a multi-core architecture. CC performs arithmetic and logical operations and has its own memory, registers, data bus, etc. CC manages the operation of the MPU, has access to SAM data, and is capable of processing this data. It is not recommended to use CC to process significant amounts of data, since this will lead to a significant decrease in the performance of the MPU. For direct access to SAM from CC, a local Matrix Register (MR) CC is required.

In the preferred embodiment, the CC should execute the following instruction groups:

1. Work with IO
    1.1 Read the matrix from the EDB and place it in the buffer (local MR IO)
    1.2 Record the matrix from the buffer in EDB
2. Work with matrix computing devices (such as MMM, MA, HP, etc.)
    2.1 Read the matrix from the MDB and write it into the indicated MR of the selected matrix computing device
    2.2 Read the matrix from the indicated MR of the selected computing device and write it in MDB
    2.3 Perform the calculation on the selected computing device and write the result to the indicated MR
3. Work with SAM
    3.1 Read the matrix from the buffer and write it to SAM at the specified index
    3.2 Read the matrix from SAM at the specified index and write it to the buffer
    3.3 Read the matrix from SAM at the specified index and write it in MDB
    3.4 Read the matrix from the MDB and write it to SAM at the specified index
    3.5 Read the matrix from SAM at the specified index and write it in MR CC
    3.6 Read the matrix from MR CC and write it to SAM at the specified index
    3.7 Read the value from MR CC at the specified address in the matrix
    3.8 Write the value in MR CC to the specified address in the matrix
    3.9 Use SAM as a matrix computing device
        3.9.1 Calculate MA
            3.9.1.1 Read the preliminary summary matrix from SAM for the specified set of indices corresponding to the summable matrices, and write it in MDB
            3.9.1.2 Read the preliminary total matrix from the MDB and write it into the MR device, normalizing the preliminary total matrix to the standard positional coding
        3.9.2 Compute the VMM
            3.9.2.1 Read preliminary vector obtained by multiplying vector defined by a set of transverse SAM indices, by the matrix recorded in the SAM layer at a specified index layer, and record the obtained preliminary vector in MDB
            3.9.2.2 Read VMM preliminary results, in the form of a vector of the MDB and to record it in the MR of the device, normalizing the provisional matrix to a standard positional encoding
        3.9.3 Perform commands for other SAM computational operations The transition from the arithmetic logic concept of the processor to the matrix one, as well as from the use of electronic circuits to the use of opto-electronic, allows to radically increase the speed and ability to handle complexity of calculations, as well as to reduce power consumption and heating.

In the preceding specification, the invention has been described with reference to specific exemplary embodiments thereof. It will however, be evident that various modifications and changes may be made thereto without departing from the broader spirit and scope of the invention as set forth in the claims that follow. The specification and drawings are accordingly to be regarded in an illustrative manner rather than a restrictive sense.

REFERENCES

[1] https://cloud.google.com/blog/big-data/2017/05/an-in-depth-look-at-googles-first-tensor-processing-unit-tpu
[2] http://besho.narod.ru/reviews/newage/EnLight256.pdf
[3] https://www.osapublishing.org/ol/ViewMedia.cfm?uri=ol-9-8-322&seq=0&guid=d6aaaf54-f305-fb9f-6c03-453f96d7ad0b

[4] https://www.semanticscholar.org/paper/A-Memristor-Crossbar-Based-Computing-Engine-Optimi-Liu-Yang/eb06412b3121f74c951741f389e99da5fd24bb57
[5] https://docs.google.com/presentation/d/1mV_wFW-gIbNcvKfE-vwulv0SAag2Rt1C3Uyp9-zhIqaY/edit#slide=id.g35833395fc_0_0

We claim as follows:

1. A matrix processing apparatus, comprising:
a three-dimensional slice access memory comprising a plurality of cells organized in a plurality of cell slices, each slice storing an entire selected data matrix, said three-dimensional slice access memory being configured to allow read/write access to said entire selected data matrix at the same time; and
an input/output block connected to said three-dimensional slice access memory and configured to format data into a format acceptable to said three-dimensional slice access memory,
wherein each of said cells of said three-dimensional slice access memory comprises a circuit having a photochrom fluorescing under an influence of illumination emitted by a light source, and a photo-resistive element, wherein light from said photochrom falls onto said photo-resistive element whose resistance depends on an intensity of said light from said photochrom.

2. The apparatus of claim 1, further comprising at least one matrix processing device configured to manipulate data in matrix form and at least one matrix data bus connecting said at least one matrix processing device to said three-dimensional slice access memory.

3. The apparatus of claim 2, wherein said at least one matrix data bus comprises a plurality of channels, and wherein a number of channels in said at least one matrix data bus corresponds to dimensions of said selected data matrix.

4. The apparatus of claim 2, wherein said at least one matrix processing device is a vector-matrix multiplication device configured to multiply a matrix by a vector.

5. The apparatus of claim 2, wherein said at least one matrix processing device is a matrix-matrix multiplication device configured to multiply a first matrix by a second matrix.

6. The apparatus of claim 2, wherein said at least one matrix processing device is a Hadamard product device configured to perform element-wise multiplication of matrices having the same dimensions.

7. The apparatus of claim 2, wherein said at least one matrix processing device is a matrix addition device configured to perform element-by-element addition of matrices having the same dimensions.

8. The apparatus of claim 2, wherein said at least one matrix processing device is a matrix determinant calculation device configured to calculate a determinant of a particular matrix.

9. The apparatus of claim 2, further comprising an external data bus and a central controller, said central controller being connected to said three-dimensional slice access memory, said at least one matrix processing device and said input/output block, wherein said external data bus is separate and distinct from said matrix data bus.

10. The apparatus of claim 9, where said central controller is configured to control at least one of said three-dimensional slice access memory, said at least one matrix processing device and said input/output block based on external instructions conveyed to said central controller via said external data bus.

11. A matrix processing apparatus, comprising:
a three-dimensional slice access memory comprising a plurality of cells organized in a plurality of cell slices, each slice storing an entire selected data matrix, said three-dimensional slice access memory being configured to allow read/write access to said entire selected data matrix at the same time; and
an input/output block connected to said three-dimensional slice access memory and configured to format data into a format acceptable to said three-dimensional slice access memory, wherein each of said cells of said three-dimensional slice access memory comprises a circuit having a photochrom fluorescing under an influence of illumination emitted by a light source, and a photocell, wherein light from said photochrom falls onto said photocell which converts fluorescence of said photochrom into an electric current.

12. A matrix processing apparatus, comprising:
a three-dimensional slice access memory comprising a plurality of cells organized in a plurality of cell slices, each slice storing an entire selected data matrix, said three-dimensional slice access memory being configured to allow read/write access to said entire selected data matrix at the same time; and
an input/output block connected to said three-dimensional slice access memory and configured to format data into a format acceptable to said three-dimensional slice access memory, wherein each of said cells of said three-dimensional slice access memory comprises a crossbar of multiple strips of light sources and multiple bands of optical summarizers positioned perpendicularly to said multiple strips of light sources, wherein each of said cells of said three-dimensional slice access memory further comprises a layer of photochromic film having a plurality of pixels, and wherein light from said light sources selectively illuminates at least some of said pixels of the photochromic film causing fluorescence of said illuminated pixels.

13. The apparatus of claim 12, wherein a light from said illuminated pixels of the photochromic film falls onto and is at least partially converted into a fluorescence of said optical summarizers.

14. The apparatus of claim 13, wherein said light from said illuminated pixels of the photochromic film is concentrated along each of said optical summarizers and is outputted from said optical summarizers as a total light signal.

15. The apparatus of claim 14, wherein said optical summarizers and said photochromic film are photochromic fluorescent optical fibers.

16. A memory device comprising:
a three-dimensional slice access memory having a plurality of cells organized in a plurality of cell slices, each slice storing an entire selected data matrix, said three-dimensional slice access memory being configured to allow read/write access to said entire selected data matrix at the same time, wherein each of said cells comprises a circuit having a photochrom fluorescing under an influence of illumination emitted by a light source, and a photo-resistive element, wherein light from said photochrom falls onto said photo-resistive element whose resistance depends on an intensity of said light from said photochrom.

17. The memory device of claim 16, wherein said circuit further comprises at least one first light emitting diode and at least one second light emitting diode, said first light emitting diode emitting a first light wavelength converting said photochrom into a fluorescent state, and said second light emitting diode emitting a second light wavelength suppressing fluorescence of said photochrom.

18. The memory device of claim 17, wherein said first light emitting diode and said second light emitting diode are connected to the same circuit in parallel with an opposite polarity.

19. The memory device of claim 16, wherein said photoresistive element is a photoresistor.

20. The memory device of claim 16, wherein said photoresistive element is a phototransistor.

21. A memory device comprising:
a three-dimensional slice access memory having a plurality of cells organized in a plurality of cell slices, each slice storing an entire selected data matrix, said three-dimensional slice access memory being configured to allow read/write access to said entire selected data matrix at the same time, wherein each of said cells comprises a circuit having a photochrom fluorescing under an influence of illumination emitted by a light source, and a photocell, wherein light from said photochrom falls onto said photocell which converts fluorescence of said photochrom into an electric current.

22. The memory device of claim 21, wherein said circuit further comprises at least one first light emitting diode and at least one second light emitting diode, said first light emitting diode emitting a first light wavelength converting said photochrom into a fluorescent state, and said second light emitting diode emitting a second light wavelength suppressing fluorescence of said photochrom.

23. The memory device of claim 22, wherein said first light emitting diode and said second light emitting diode are connected to the same circuit in parallel with an opposite polarity.

24. A memory device comprising:
a three-dimensional slice access memory having a plurality of cells organized in a plurality of cell slices, each slice storing an entire selected data matrix, said three-dimensional slice access memory being configured to allow read/write access to said entire selected data matrix at the same time, wherein each of said cells comprises a crossbar of multiple strips of light sources and multiple bands of optical sunmiarizers positioned perpendicularly to said multiple strips of light sources, wherein each of said cells of said three-dimensional slice access memory further comprises a layer of photochromic film having a plurality of pixels, and wherein light from said light sources selectively illuminates at least some of said pixels of the photochromic film causing fluorescence of said illuminated pixels.

25. The memory device of claim 24, wherein a light from said illuminated pixels of the photochromic film falls onto and is at least partially converted into a fluorescence of said optical summarizers.

26. The memory device of claim 25, wherein said light from said illuminated pixels of the photochromic film is concentrated along each of said optical summarizers and is outputted from said optical summarizers as a total light signal.

27. The memory device of claim 26, wherein said optical summarizers and said photochromic film are photochromic fluorescent optical fibers.

* * * * *